(12) United States Patent
Tetzlaff et al.

(10) Patent No.: US 10,387,583 B2
(45) Date of Patent: Aug. 20, 2019

(54) ROTATIONS FROM GRADIENT DIRECTIONS

(71) Applicant: Schlumberger Technology Corporation, Sugar Land, TX (US)

(72) Inventors: Daniel M. Tetzlaff, Houston, TX (US); Colin Daly, London (GB)

(73) Assignee: Schlumberger Technology Corporation, Sugar Land, TX (US)

( * ) Notice: Subject to any disclaimer, the term of this patent is extended or adjusted under 35 U.S.C. 154(b) by 626 days.

(21) Appl. No.: 13/686,948

(22) Filed: Nov. 28, 2012

(65) Prior Publication Data

US 2013/0144579 A1    Jun. 6, 2013

Related U.S. Application Data

(60) Provisional application No. 61/566,100, filed on Dec. 2, 2011.

(51) Int. Cl.
*G01V 99/00* (2009.01)
*G06F 17/50* (2006.01)

(52) U.S. Cl.
CPC ........ *G06F 17/5009* (2013.01); *G01V 99/005* (2013.01); *G01V 2210/64* (2013.01); *G01V 2210/74* (2013.01)

(58) Field of Classification Search
None
See application file for complete search history.

(56) References Cited

U.S. PATENT DOCUMENTS

| 6,106,561 | A  | * | 8/2000  | Farmer ................. G01V 1/282 |
|           |    |   |         |                            345/423 |
| 7,379,854 | B2 |   | 5/2008  | Calvert et al. |
| 7,561,992 | B2 |   | 7/2009  | Leflon et al. |
| 7,630,517 | B2 |   | 12/2009 | Mirowski et al. |
| 8,010,294 | B2 | * | 8/2011  | Dorn et al. ..................... 702/14 |

(Continued)

FOREIGN PATENT DOCUMENTS

| EP | 1584951 A1    | 10/2005 |
| FR | 2890453 A1    | 3/2007  |
| WO | 2010047859 A1 | 4/2010  |

OTHER PUBLICATIONS

De Groot, Paul, Geert de Bruin, and Nanne Hemstra. "How to create and use 3D Wheeler transformed seismic volumes." 2006 SEG Annual Meeting. Society of Exploration Geophysicists, 2006.*

(Continued)

*Primary Examiner* — Bijan Mapar

(57) ABSTRACT

A method can include defining a two dimensional grid of cells for a region associated with a geologic environment, assigning directions to at least some of the cells, tracing a first set of trajectories with respect to the grid based on the directions, determining a first set of scalar field values based on the first set of trajectories, rotating the directions, tracing a second set of trajectories with respect to the grid based on the rotated directions, determining a second set of scalar field values based on the second set of trajectories, outputting a map based on the first set of scalar field values and the second set of scalar field values and applying the map to map a spatially distributed variable in the region associated with the geologic environment. Various other apparatuses, systems, methods, etc., are also disclosed.

19 Claims, 15 Drawing Sheets

(56) References Cited

U.S. PATENT DOCUMENTS

| | | |
|---|---|---|
| 8,019,577 B2 | 9/2011 | Labourdette |
| 2005/0228623 A1 | 10/2005 | Leflon et al. |
| 2006/0052938 A1 | 3/2006 | Thorne et al. |
| 2012/0130693 A1* | 5/2012 | Ertas ............... E21B 44/00 703/2 |

OTHER PUBLICATIONS

Li, Hongmei, and Jef Caers. "Geologic modeling and history matching of multi-scale flow barriers in deep-water reservoirs: methodology and field application." (2008).*

Peikert (Peikert, Ronald, and Martin Roth. "The"parallel vectors" operator—a vector field visualization primitive." Visualization'99. Proceedings. Ieee, 1999.).*

Miura, Hideaki, and Shigeo Kida. "Identification of tubular vortices in turbulence." Journal of the Physical Society of Japan 66.5 (1997): 1331-1334. (Year: 1997).*

Alapetite, et al., "Stochastic Modeling of Fluvial Reservoir: The YACS Approach", SPE 97271—SPE Annual Technical Conference and Exhibition, Dallas, Texas, Oct. 9-12, 2005, 5 pages.

Arpart, et al., "A Multiple-scale, Pattern-based Approach to Sequential Simulation", Quantitative Geology and Geostatistics, vol. 14, Springer: The Netherlands, 2005, pp. 255-264.

Leflon, et al., "Simulation of channels in reservoir modeling: A new approach", 25th Gocad Meeting, Jun. 2005, 9 pages.

Li, et al., "Geologic Modeling and History Matching of Multi-Scale Flow Barriers in Deep-Water Reservoirs: Methodology and Field Application", Search and Discovery Article #40491, adapted from poster presentation at AAPG Annual Convention and Exhibition, Denver, CO, Jun. 7-10 2009, Posted Feb. 26, 2010, 4 pages.

Zhang, et al., "Filter-Based training Pattern Classification for Spatial Pattern Simulation", A Dissertation Submitted to the Department of Geological and Environmental Sciences and the Committee on Graduate Studies of Standford University, Stanford, CA, Mar. 2006, 146 pages.

Preliminary Search Report of Nov. 17, 2015 of INPI (France), FR Application No. 1261488, filed Nov. 30, 2012 (10 pages).

Jones, Using flowpaths and vector fields in object-based modeling, Computers & Geosciences 27 (2001) 133-138 (6 pages).

* cited by examiner

Spatially Distributed Variable 404

Map 480

Scalar Field Values 440    Scalar Field Values 470

Mapped Spatially Distributed Variable 408

2-D Grid of Cells 712

Traces for 2-D Grid of Cells 1012

Scalar Field Values 1016

| -1 | 4 | 8 | 13 | 18 | 19 |
| -4 | 0 | 5 | 9 | 14 | 19 |
| -4 | -1 | 4 | 8 | 13 | 18 |
| -4 | 0 | 6 | 11 | 17 | 20 |
| -2 | 3 | 8 | 13 | 18 | 20 |
| 0 | 3 | 8 | 12 | 17 | 20 |

Method 1050

Traces for 2-D Grid of Cells 1112

Direction Field 1212

Channels Model 1222

Mapped Channels Model 1232

Method 1260

ROTATIONS FROM GRADIENT DIRECTIONS

RELATED APPLICATION

This application claims the benefit of the U.S. Provisional Patent Application having Ser. No. 61/566,100, filed on Dec. 2, 2011, entitled "Generating a scalar field from gradient directions and applying local rotations to a surface or spatial representation of a variable," the disclosure of which is incorporated by reference herein in its entirety.

BACKGROUND

A multidimensional environment may include features or structures where information is lacking to adequately describe them, for example, for purposes of modeling the environment or otherwise understanding better the environment. As an example, consider a two-dimensional environment or a two-dimensional surface, which may be a projection of a three-dimensional environment, where information is limited as to a feature that extends across at least a portion of the environment or the surface. In such an example, where two points are available for the feature, through linear interpolation, the feature may be represented as a line. However, in reality, the feature may be known to vary with respect to its position in the environment (e.g., due to underlying physical phenomena, etc.) and, consequently, representing the feature as a line makes little sense.

Various technologies, techniques, etc., described herein can include use of direction information, for example, to generate a surface, a map, etc., which, in turn, may be used to refine a representation of a feature, a structure, etc., within an environment.

SUMMARY

A method can include generating a map based on directions in a two dimensional grid of cells and applying the map to a spatially distributed variable to map that spatially distributed variable. A system can include a processor, memory and computer-executable instructions stored in the memory for execution by the processor to provide a model that includes a spatially distributed variable associated with a geologic environment, associate a direction with a region of the model, generate a map that includes scalar field values for the region, and apply the map to the region of the model to redistribute the spatially distributed variable. One or more computer-readable storage media can include computer-executable instructions to instruct a computing device to: select a cell of a two dimensional grid of cells that includes a direction, perform a trace with respect to the two dimensional grid of cells based on the direction (e.g., across at least a portion of the two dimensional grid of cells based on the direction), and assign values to intersection points between the trace and edges of the cells according to a rule. Various other apparatuses, systems, methods, etc., are also disclosed.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

DETAILED DESCRIPTION

Figure 1:
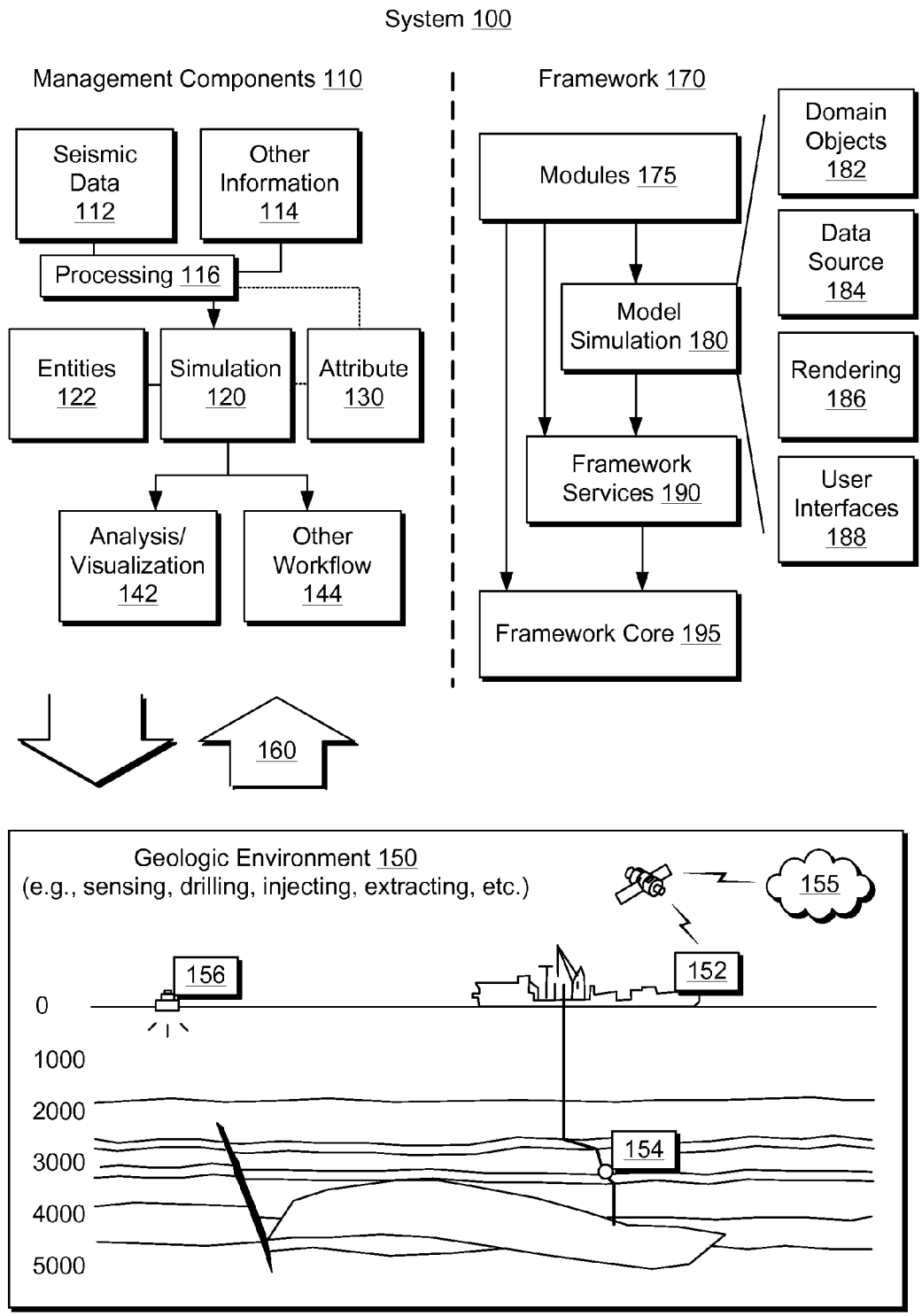
FIG. 1 illustrates an example system that includes various components for simulating a geologic environment.

The following description includes the best mode presently contemplated for practicing the described implementations. This description is not to be taken in a limiting sense, but rather is made merely for the purpose of describing the general principles of the implementations. The scope of the described implementations should be ascertained with reference to the issued claims.

As mentioned, a multidimensional environment may include features or structures where information is lacking to adequately describe them, for example, for purposes of modeling the environment or otherwise understanding better the environment. As an example, consider a sedimentary basin as a three-dimensional environment that includes channels where information about the locations of the channels is limited. While linear interpolation may be applied to the limited location data to trace the channels with respect to the sedimentary basin (e.g., across at least a portion of the sedimentary basin), underlying physical phenomena may produce sinuous channels. Accordingly, linear representation of the channels may be erroneous. In such an example, to provide a better representation, a method can include providing direction information, generating a surface or a map based on the direction information and then transforming or supplementing the limited location data using the surface or the map. Such an approach may represent channels with more accuracy, as may be expected due to the underlying physical phenomena. Further, such an approach may alter, at least within some regions, direction of one or more channels (e.g., such that channels in a channel field do not merely traverse a region in a parallel in a relatively uniform direction such as North to South). As an example, a method may introduce, at least in part, some stochastic character via direction information. For example, where sparse direction information is provided for a region, a stochastic algorithm may act to "fill-in" in direction information within the region (e.g., to add a more stochastic, sinuous, etc., character).

When modeling an environment using a model, as an example, a method can include generating a map based on direction information and then applying the map to refine the model, model data or the model and model data. For example, as to refining the model, phenomena associated with a sedimentary basin (e.g., a subsurface region, including, without limitation, a region below a ground surface, water surface, etc.) may be modeled using various equations (e.g., stress, fluid flow, phase, etc.) where such equations may be discretized using a grid that includes nodes, pillars, cells, etc. Where a method includes generating a map, the map may be applied to refine the nodes, pillars, cells, etc. to thereby refine the model. As to refining model data, where physical properties are assigned to locations that coincide with nodes, pillars, cells, etc., a method that includes generating a map may include applying the map to map the properties to other locations and, for example, interpolating the mapped properties to provide refined values of those properties at the locations of the nodes, pillars, cells, etc. As an example, a method may include a combination of model grid refinement and model data refinement. In various examples, a map may be applied to one or more spatially distributed variables (e.g., variables for physical properties, variables that locate at least a portion of a model grid, etc.).

As to a sedimentary basin that includes features or structures such as channels, such channels may include sand or other types of lithologies (e.g., facies), which may be characterized by physical properties such as porosity, permeability, size, shape, degree of continuity and connectivity, flow barriers, etc. A channel or channels may impact where fluids (e.g., hydrocarbon, water, etc.) have flowed, are flowing or will flow. As an example, consider a basin that includes one or more fluvial reservoirs characterized by features such as channels, levees, crevasses, deltaic lobes, turbidic lobes, etc. A model of a basin that accurately positions such features may better model past, present and future behavior of the basin, which can assist with field development. For example, field development and production may be facilitated by knowledge of channel connectivity, tortuosity, etc., to understand where fluid may reside, flow, etc. Techniques that can generate geologically realistic inter-connectivities of channels can facilitate basin modeling. For example, realistic representations of high-flow channels in a model of a basin can assist with prediction and assessment of production scenarios for production of a resource or resources from the basin.

As an example, a method that can assist with modeling of one or more features of a basin includes generating a scalar field from gradient directions and, based on the generated scalar field, applying local rotations to a surface or spatial representation of a variable. In such a method, the one or more features may include one or more channels of a basin. As to generating a scalar field, such a method can include defining a two-dimensional grid of cells (e.g., X and Y), providing direction data for at least some of the cells (e.g., data as to gradient directions), tracing trajectories with respect to the grid (e.g., across at least a portion of the grid) based at least in part on the direction data, and determining scalar field values (e.g., X values), based on at least a portion of the trajectories, to generate a first scalar field (e.g., a scalar field X).

As to scalar field generation, for generation of scalar values in two-dimensions, such a method can include rotating directions of the grid by a number of degrees (e.g., approximately 90 degrees or approximately 270 degrees), tracing trajectories with respect to the grid based at least in part on the rotated directions (e.g., across at least a portion of the grid based at least in part on the rotated directions), determining scalar field values (e.g., Y values) based on at least a portion of the trajectories for the rotated directions to generate a second scalar field (e.g., a rotated scalar field Y), and, for example, applying a map based on the first and second scalar fields (e.g., a field of X, Y values) to a spatially distributed variable. Once the map is applied to a spatially distributed variable, a new spatial distribution of the variable results, for example, where the variable has been rotated locally to conform to the provided direction data.

As an example, a method can include defining a two-dimensional grid of cells, assigning directions to at least some of the cells, tracing a first set of trajectories with respect to the grid based on the directions (e.g., across at least a portion of the grid based on the directions), determining a first set of scalar field values based on the first set of trajectories, rotating the directions to provide rotated directions, tracing a second set of trajectories with respect to the grid based on the rotated directions (e.g., across at least a portion of the grid based on the rotated directions), determining a second set of scalar field values based on at least a portion of the second set of trajectories, and outputting a map for locally rotating a spatially distributed variable, the map based on the first set of scalar field values and the second set of scalar field values. Such a method may further include applying the map to a spatially distributed variable to locally rotate the spatially distributed variable.

As to rotating directions to provide scalar field values for rotated directions, such rotating may rotate or transform assigned directions (e.g., an original set of directions) such that the rotated directions are orthogonal to the assigned directions. For example, a rotation for purposes of scalar field generation may be e.g., approximately 90 degrees, approximately 270 degrees, approximately −90 degrees or approximately −270 degrees. As an example, where a grid of cells is other than orthogonal, a rotation for purposes of scalar field generation may apply an appropriate angle of rotation, which may be other than e.g., approximately 90 degrees, approximately 270 degrees, approximately −90 degrees or approximately −270 degrees.

As an example, a method can include generating a surface based on direction information where the surface may be defined by traces in a grid of cells. In such an example, the traces may be subject to spatial processing, which may produce more uniform traces within the grid and, consequently, a more uniformly defined surface. As an example, such a surface may be used to intersect another surface (e.g., a randomly generated surface, which may include points therein based on measurements or other data).

FIG. 1 shows an example of a system 100 that includes various management components 110 to manage various aspects of a geologic environment 150 (e.g., an environment that includes a sedimentary basin). For example, the management components 110 may allow for direct or indirect management of sensing, drilling, injecting, extracting, etc., with respect to the geologic environment 150. In turn, further information about the geologic environment 150 may become available as feedback 160 (e.g., optionally as input to one or more of the management components 110).

In the example of FIG. 1, the management components 110 include a seismic data component 112, an additional information component 114 (e.g., well/logging data), a processing component 116, a simulation component 120, an attribute component 130, an analysis/visualization component 142 and a workflow component 144. In operation, seismic data and other information provided per the components 112 and 114 may be input to the simulation component 120.

In an example embodiment, the simulation component 120 may rely on entities 122. Entities 122 may include earth entities or geological objects such as wells, surfaces, reservoirs, etc. In the system 100, the entities 122 can include virtual representations of actual physical entities that are reconstructed for purposes of simulation. The entities 122 may include entities based on data acquired via sensing, observation, etc. (e.g., the seismic data 112 and other information 114). An entity may be characterized by one or more properties (e.g., a geometrical pillar grid entity of an earth model may be characterized by a porosity property). Such properties may represent one or more measurements (e.g., acquired data), calculations, etc.

In an example embodiment, the simulation component 120 may rely on a software framework such as an object-based framework. In such a framework, entities may include entities based on pre-defined classes to facilitate modeling and simulation. A commercially available example of an object-based framework is the MICROSOFT® .NET™ framework (Redmond, Wash.), which provides a set of extensible object classes. In the .NET™ framework, an object class encapsulates a module of reusable code and associated data structures. Object classes can be used to instantiate object instances for use in by a program, script, etc. For example, borehole classes may define objects for representing boreholes based on well data.

In the example of FIG. 1, the simulation component 120 may process information to conform to one or more attributes specified by the attribute component 130, which may include a library of attributes. Such processing may occur prior to input to the simulation component 120 (e.g., consider the processing component 116). As an example, the simulation component 120 may perform operations on input information based on one or more attributes specified by the attribute component 130. In an example embodiment, the simulation component 120 may construct one or more models of the geologic environment 150, which may be relied on to simulate behavior of the geologic environment 150 (e.g., responsive to one or more acts, whether natural or artificial). In the example of FIG. 1, the analysis/visualization component 142 may allow for interaction with a model or model-based results. As an example, output from the simulation component 120 may be input to one or more other workflows, as indicated by a workflow component 144.

In an example embodiment, the management components 110 may include features of a commercially available simulation framework such as the PETREL® seismic to simulation software framework (Schlumberger Limited, Houston, Tex.). The PETREL® framework provides components that allow for optimization of exploration and development operations. The PETREL® framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes. Such a framework may be considered an application and may be considered a data-driven application (e.g., where data is input for purposes of simulating a geologic environment).

In an example embodiment, various aspects of the management components 110 may include add-ons or plug-ins that operate according to specifications of a framework environment. For example, a commercially available framework environment marketed as the OCEAN® framework environment (Schlumberger Limited, Houston, Tex.) allows for seamless integration of add-ons (or plug-ins) into a PETREL® framework workflow. The OCEAN® framework environment leverages .NET® tools (Microsoft Corporation, Redmond, Wash.) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

FIG. 1 also shows an example of a framework 170 that includes a model simulation layer 180 along with a framework services layer 190, a framework core layer 195 and a modules layer 175. The framework 170 may include the commercially available OCEAN® framework where the model simulation layer 180 is the commercially available PETREL® model-centric software package that hosts OCEAN® framework applications. In an example embodiment, the PETREL® software may be considered a data-driven application. The PETREL® software can include a framework for model building and visualization. Such a model may include one or more grids.

The model simulation layer 180 may provide domain objects 182, act as a data source 184, provide for rendering 186 and provide for various user interfaces 188. Rendering 186 may provide a graphical environment in which applications can display their data while the user interfaces 188 may provide a common look and feel for application user interface components.

In the example of FIG. 1, the domain objects 182 can include entity objects, property objects and optionally other objects. Entity objects may be used to geometrically represent wells, surfaces, reservoirs, etc., while property objects may be used to provide property values as well as data versions and display parameters. For example, an entity object may represent a well where a property object provides log information as well as version information and display information (e.g., to display the well as part of a model).

In the example of FIG. 1, data may be stored in one or more data sources (or data stores, generally physical data storage devices), which may be at the same or different physical sites and accessible via one or more networks. The model simulation layer 180 may be configured to model projects. As such, an example project may be stored where stored project information may include inputs, models, results and cases. Thus, upon completion of a modeling session, a user may store a project. At a later time, the project can be accessed and restored using the model simulation layer 180, which can recreate instances of the relevant domain objects.

In the example of FIG. 1, the geologic environment 150 may be outfitted with any of a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a well site and include sensing, detecting, emitting or other circuitry. Such equipment may include storage and communication circuitry to store and to communicate data, instructions, etc.

Figure 2:
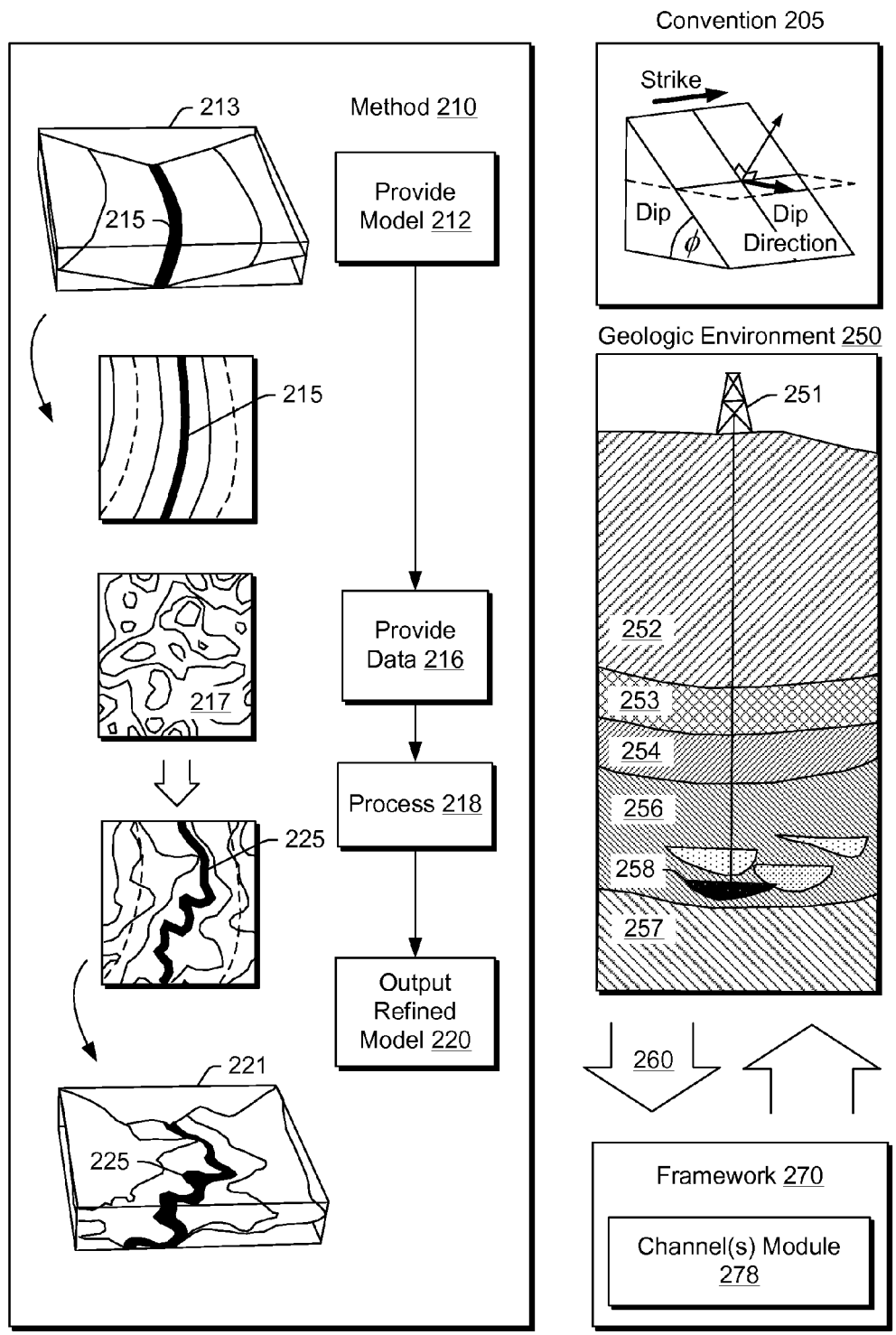
FIG. 2 illustrates an example of a method, an example of a geologic environment and an example of a framework.

FIG. 2 shows an example of a convention 205, an example of a method 210, an example of a geologic environment 250 and an example of a framework 270.

As an example, seismic interpretation may aim to identify and classify one or more subsurface boundaries based on information such as local structural azimuth, dip angle, dip azimuth or dip direction, strike azimuth or strike direction, etc. Such interpretation may refer to a convention, for example, such as the convention 205 of FIG. 2 where, for local structural azimuth and dip angle, azimuth may be defined as a direction normal to a surface whereas dip angle may be defined as the angle of that surface. Such a convention may be used with respect to one or more attributes associated with seismic data (see, e.g., block 130 of FIG. 1). In terms of attitude, a strike direction may be defined as a compass bearing of a horizontal line on a dipping layer where dip angle is the angle of the inclination of the bed measured perpendicular to the strike direction. Local structural azimuth may be a perpendicular measure to a strike direction and be specified by a compass direction (e.g., 0 degrees to 360 degrees) of the normal to a plane of the dipping layer. Dip azimuth or dip direction may also be perpendicular to strike azimuth or strike direction.

As to dip angle, as an example, dip angle can be defined as a steepest angle of descent of a tilted bed or feature relative to a horizontal plane and may be specified using e.g., an angle between approximately 0 degrees and approximately 90 degrees and optionally a letter (e.g., N, S, E, and W) or other moniker to denote an approximate direction in which the bed is dipping (e.g., a dip direction). As an example, various types of features may be described, in part, by dip angle (e.g., sedimentary bedding, faults and fractures, cuestas, igneous dikes and sills, metamorphic foliation, etc.).

As to a dip azimuth or dip direction, it is a direction of a surface's dip, for example, in a direction of steepest descent relative to a direction such as North. As to a strike azimuth or strike direction, it is a direction perpendicular to the dip azimuth or dip direction. As an example, in the geosciences, it is sometimes desirable to define a surface (e.g., represented by elevation values on a grid) based on information about the surface's dip azimuth (e.g., dip direction) or strike azimuth (e.g., strike direction) at a discrete set of points, for example, without knowledge of the magnitude (or absolute value) of the dip. Such an example is akin to finding a scalar field from information about the direction of its gradient but not the absolute value of its gradient. As an example, direction information may include direction information with or without magnitude. As an example, direction information may include a surface direction or a "projected" direction (e.g., dip direction or strike direction) onto a 2D grid (e.g., a 2D projection of a 3D vector).

In various examples, values for dip direction or dip azimuth, strike direction or strike azimuth or both dip direction or dip azimuth and strike direction or strike azimuth may be provided.

As an example, the method 210 of FIG. 2 can provide for definition of such a surface or, for example, a map. For example, a method can include generating a map based on direction information and then applying the map for mapping, transforming or displacing values, for example, where the values may represent one or more physical properties, one or more features, one or more structures, one or more locations of nodes or elements of a model, etc. In such an example, the method may act to spatially refine an existing set of data within an environment (e.g., whether the environment is natural, modeled, etc.).

In FIG. 2, the geologic environment 250 includes equipment 251 located on an upper surface of a formation that includes various layers 252, 253, 254, 255, 256 and 257. The equipment 251 may be a platform, a rig, etc., for drilling, sensing, injecting, etc. For example, the equipment 251 may be a rig for forming a borehole or well to the layer 256 to access a channel 258.

In the example of FIG. 2, the layer 256 is shown as including various channels in addition to the channel 258, which may be filled with sediments such as turbidites. Collectively, the channels may define a channel complex. As an example, a channel complex (e.g., or channel fairway) may arise from a succession of channel migration sequences. Channel complexes may include one or more channels having potential oil bearing reservoirs (e.g., due to porosity, permeability, etc.).

As shown in FIG. 2, the method 210 can include a provision block 212 for providing a model 213 that represents a region that includes a channel 215, a provision block 216 for providing data 217, a process block 218 for processing the model 213 and the data 217, and an output block 220 for outputting a refined model 221 that includes a refined channel 225, which may more realistically represent the channel 215.

In the example of FIG. 2, the channel 215 has a channel width that may be constant or varying over a channel length. The channel 215 may also include a constant or varying channel depth over the channel length. As shown in FIG. 2, the model 213 may include relatively smooth potentials over a region about the channel 215, for example, where the channel 215 has a base potential. Such potentials may be represented in a two-dimensional plot, for example, using contours. Through input of additional data 217 and processing 218, the channel 215 may be represented (e.g., in two or three dimensions) as having a more realistic shape, size, etc., as indicated by the channel 225. For example, the channel 225 includes sinuous features that may be formed via erosion, deposits, etc. The channel 225 may be considered a "stochastically" modeled channel, for example, depending on the nature of the provided data 217, the processing of the process block 218, etc.

In the example of FIG. 2, the framework 270 may include a module 278 for performing a process such as the process of the process block 218 of the method 200. As shown, output from the framework 270 may be applied to the geologic environment 250, for example, by adjusting one or more operational parameters associated with the equipment 251 (e.g., or other equipment). In turn, feedback 260 may be provided to the framework 270. Such feedback may be quantitative data, qualitative data or qualitative data and quantitative data. As an example, the geologic environment 251 may be outfitted with one or more sensor that can output data to the framework 270 (e.g., via one or more network connections). In such an example, the data may be provided to the module 278 for outputting one or more refined models of at least a portion of the geologic environment 250 (e.g., refined with respect to one or more channels or other features).

Figure 3:
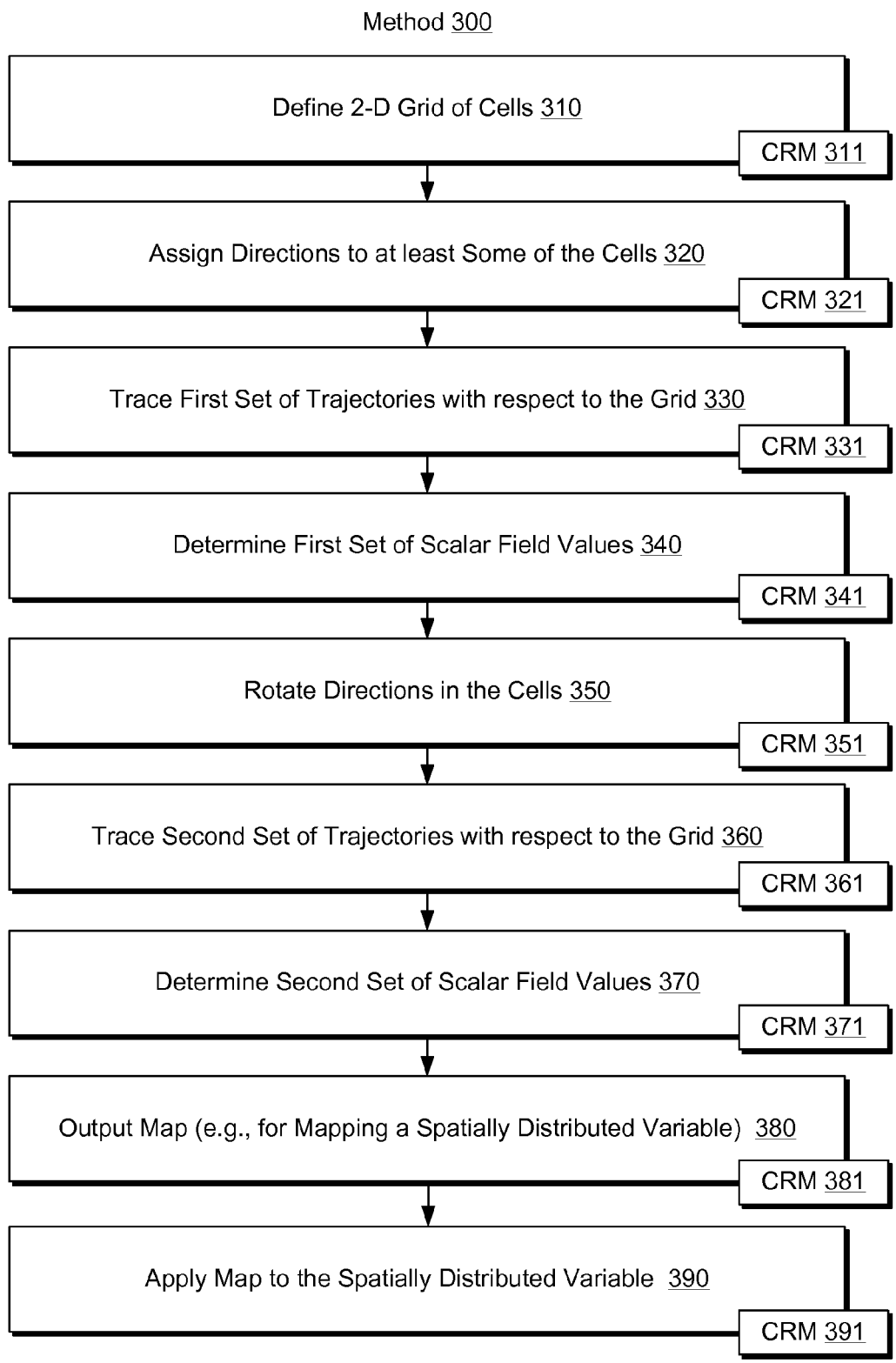
FIG. 3 illustrates an example of a method.

FIG. 3 shows an example of a method 300, which may optionally be applied to refine a model. In the example of FIG. 3, the method 300 includes a definition block 310 for defining a 2-D grid of cells, an assignment block 320 for assigning directions to at least some of the cells, a trace block 330 for tracing a first set of trajectories with respect to the grid (e.g., across at least a portion of the grid), a determination block 340 for determining a first set of scalar field values, a rotate block 350 for rotating directions in the cells, a trace block 360 for tracing a second set of trajectories with respect to the grid (e.g., across at least portion of the grid), a determination block 370 for determining a second set of scalar field values, an output block 380 for outputting a map (e.g., a map for mapping a spatially distributed variable) and an application block 390 for applying the output map to the spatially distributed variable (e.g., to map the the spatially distributed variable).

The method 300 is shown in FIG. 3 in association with various computer-readable media (CRM) blocks 311, 321, 331, 341, 351, 361, 371, 381 and 391. Such blocks generally include instructions suitable for execution by one or more processors (or cores) to instruct a computing device or system to perform one or more actions. While various blocks are shown, a single medium may be configured with instructions to allow for, at least in part, performance of various actions of the method 300. As an example, a computer-readable medium (CRM) may be a computer-readable storage medium.

As an example, the method 300 may be applied for reconstruction of paleotopographic surfaces from directional data (e.g., for use by the assignment block 320). In such an example, the directional data may include data as to dip (e.g., dip azimuth or dip direction) of primary depositional features, paleoshore directions, paleocurrent directions, etc.

As another example, the method 300 may be applied to define a surface for use in modeling channels by intersecting (e.g., processing) the surface in conjunction with a random surface. Such an approach may be considered a statistical approach, stochastic approach, etc., to channel modeling. As an example, consider at least some of the data 217 of FIG. 2 as being data generated, in part, through use of a random number generator. In the example of FIG. 2, the provision block 216 may provide directional data and data generated using a random number generator and the processing block 218 may process it such that the output block 220 can output a refined model that represents a channel (or channels) that conform, at least in part, to the data. In such an example, the processing of the process block 218 may include one or more actions of one or more of the blocks 310 to 380 of the method 300. In such an example, a surface may be generated based on at least a portion of the directional data where the processing block 218 acts to intersect a random surface with the generated surface, for example, such that the output block 220 may output a refined model, a refined representation of a feature, a refined representation of a structure, etc. (e.g., consider the channel 215 as being refined to the channel 225 in FIG. 2).

As an example, a random surface may be a surface whose elevation values are random but may be spatially correlated so that the surface may be locally continuous, or locally differentiable (e.g., "smooth"), while still exhibiting random fluctuations over larger areas. As an example, a global statistical distribution of elevations may be Gaussian, in which case a random surface may be referred to as a Gaussian random surface.

In the examples of FIG. 2 and FIG. 3, the method 210 and the method 300 may operate to refine a model based on directional data (e.g., direction data), where such data may come from one or more sources (e.g., measured data, generated data, measured data and generated data, etc.). As an example, a method may be applied to refine a model based on local directional data, which may be sparse for a region. Where data are sparse, processing of the model and the data may compensate for sparseness through interpolation, generation, etc.

As an example, a method can include generating a scalar field as a surface (e.g., a two-dimensional surface) that approximates given gradient directions. Such a method can include checking direction data (e.g., gradient directions) for inconsistencies such as loops, singularities, and discontinuities. Such a method can include, from each point, defining a trajectory (e.g., a trace) that follows the direction defined in each cell both forward and backward. Such a method can include following the trajectory (e.g., the trace) from a plurality of cells (e.g., cell to cell) until both ends reach a grid edge. As an example, such a method may include storing the points of intersection between the trajectory (e.g., the trace) and the cell edges, and whether the intersection is positive (e.g., to the left or up in a two dimensional grid) or negative (e.g., to the right or down in a two dimensional grid). As an example, one or more characteristics of an intersection (e.g., whether positive, negative, etc.) may be based on a rule or rules.

As an example, a method can include starting at an arbitrary node in a two dimensional grid with an arbitrary value (e.g., lower left, with a value of 0), following cell edges to accumulate a number (e.g., and sign) of intersection points and assigning to each node the accumulated value. In such an example, the value assigned to each node is a scalar that defines a desired field or surface.

As an example, a method may include remapping node values using a normalization procedure to reduce variation in an absolute value of a gradient. As an example, where scalar field values are to be provided with respect to two coordinates (e.g., x and y), such a method may include providing a first set of scalar field values based on directions and then rotating the directions by e.g., approximately 90 degrees and repeating tracing, assigning and accumulating to provide another set of scalar field values. In such a method, where a first set of scalar field values is referred to as X and a second set of scalar field values is referred to as Y (e.g., for rotated directions), then the X and Y values at each node can define a one-to-one continuous mapping (e.g., from a node's position in the grid to the point defined by the X and Y coordinates for that node). Such a map may be applied to one or more spatially distributed variables, for example, to provide a new spatial distribution of the variable (e.g., that rotates features locally to conform to given directions).

Referring again to FIG. 2, particularly the model 213 that represents a region that includes the channel 215 and the refined model 221 that includes the refined channel 225 (e.g., as a more realistic representation of the channel 215), some approaches for channel refinement are described in Leflon et al. (Leflon B., Alapetite J., Gringarten E., Mallet J.-L., 2005: "Simulation of channels in reservoir modeling: A new approach", 25th Gocad Meeting, June 2005) and Alapetite et al. (Alapetite J., Leflon B., Gringarten E., Mallet J.-L., 2005: "Stochastic Modeling of Fluvial Reservoirs: the YACS Approach", Society of Petroleum Engineers, SPE 97271). The approaches described by Leflon et al. and Alapetite et al. generate models of channels that pass through predetermined points and have applications, for example, in modeling ancient geologic settings where positions of some channels are known at certain points, namely where they are intersected by wells, but are not known, or known vaguely, elsewhere (see, e.g., the geologic environment 250 where a channel may be intersected by a well while others may not be intersected by a well). Such approaches can include generating a random surface (e.g., as an irregular but locally smooth surface) and then intersecting that surface with an inclined plane such that the intersection of the surface with the inclined plane is a trajectory that resembles a centerline of a channel.

As an example, a random surface may be conditioned to substantially honor a set of points of fixed elevation (e.g., to produce a set of surfaces such that each of the surfaces passes through each of the points in the set, but elsewhere differs randomly from other surfaces). In such an example, by applying one of the approaches of Leflon et al. or Alapetite et al. to a set of surfaces, it may become possible to generate a set of random channels that pass through a predetermined set of points but that differ from one another elsewhere. The result of such an example may prove useful in modeling geologic settings that contain channels whose positions are known with relative certainty at a few points.

The approaches of Leflon et al. and Alapetite et al. can generate channels that have an overall average direction that tends to be constant and that tends to coincide with the strike direction of the inclined plane used to intersect the random surface. Leflon et al. and Alapetite et al. also generalize to scenarios where it is known, a priori, that the general channel direction is not constant but changes throughout the area (e.g., as provided from the paleogeographic setting or from seismic data). In particular, Leflon et al. and Alapetite et al. achieve channels that adapt to locally known directions by using a curved surface instead of a plane to intersect the random surface where the curved surface has locally a strike direction that coincides with the known average channel direction.

Referring again to FIG. 2, dashed lines bounding the unrefined channel 215 are representative of such a curved surface, for example, a surface that has locally a strike direction that coincides with a known average channel direction. Further, the data 217 may be provided as a set of points of fixed elevation where contours (e.g., as shown) represent a random surface conditioned to honor that set of points. Next, in an approach such as that of Leflon et al. or Alapetite et al., the curved surface (i.e., having locally a strike direction that coincides with a known average channel direction) may be used to intersect the random surface to produce a refined channel. For example, a refined channel may result such as the refined channel 225 of FIG. 2.

As an example, a method can include generating a surface from arbitrary or other directional data where such a surface may be used in an approach such as an approach described by Leflon et al. or Alapetite et al. For example, given a direction field (e.g., at least some directional data, optionally arbitrary directional data), a method can include generating a surface from the direction field and then, for example, using the generated surface for intersecting another surface such as a random surface (e.g., a random surface conditioned to honor a set of points of fixed elevation). As an example, a method can include building a curved surface from channel fairway directional data directly and optionally modeling channels of the channel fairway stochastically, for example, by intersecting one or more random surfaces (e.g., one or more Gaussian random surfaces) with the built curved surface.

Figure 5:
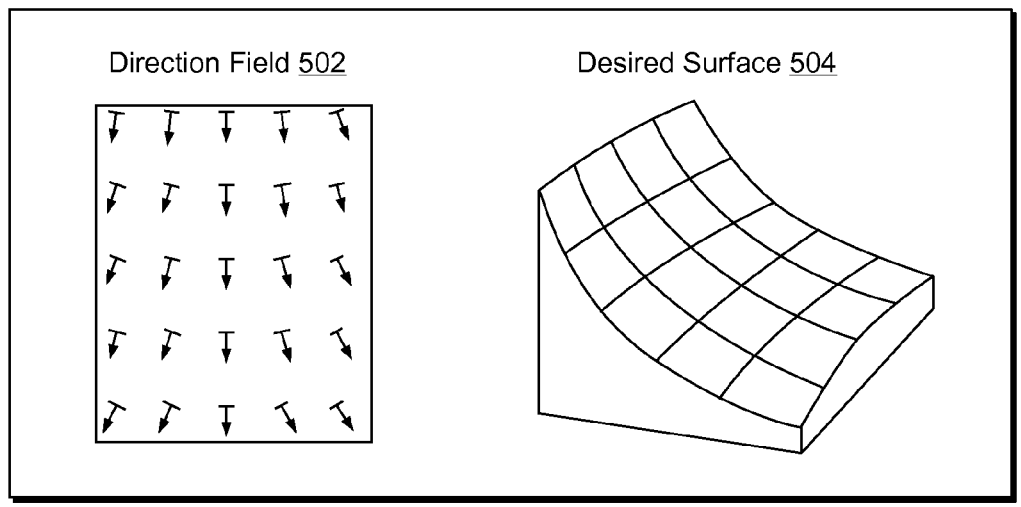
FIG. 5 illustrates an example of a direction field, an associated desired surface and an example of an assignment process to assign directions to cells in a two dimensional grid of cells.
Figure 5:
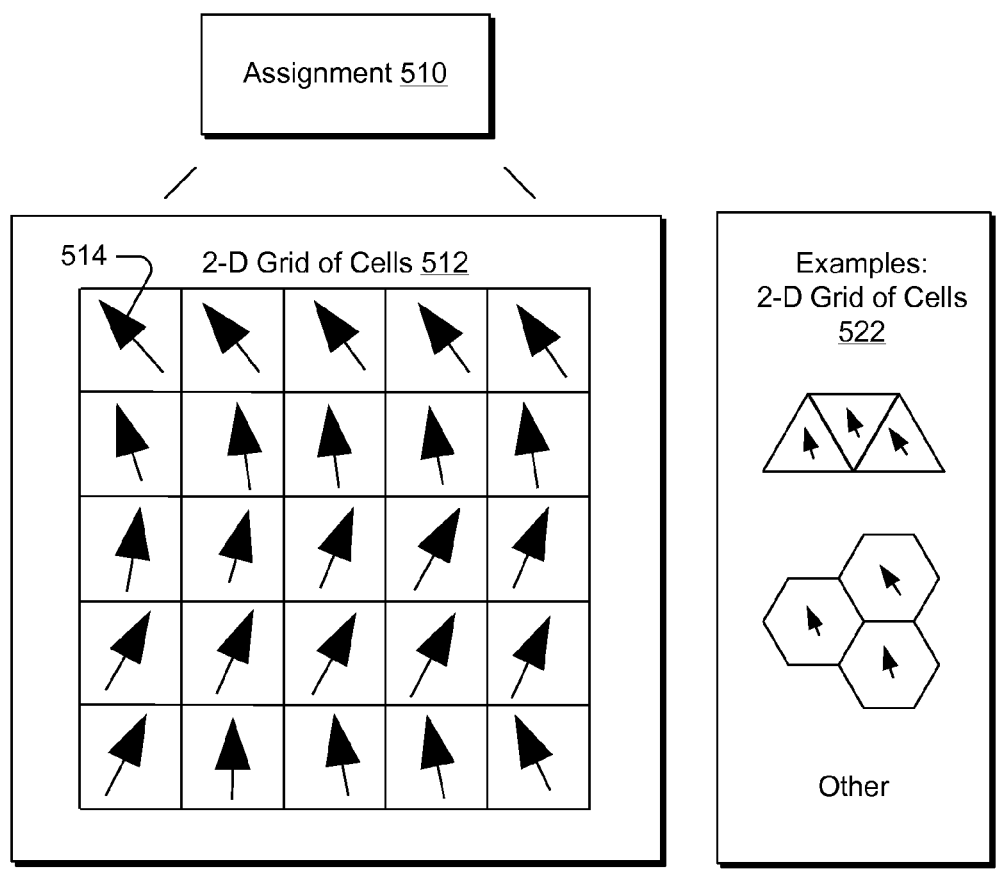

As an example, a method can include generating a desired surface (see, e.g., a desired surface 504 of FIG. 5) from arbitrary directional data (e.g., using a set of known directions) by mapping directions of the directional data onto a grid consisting of a set of cells, interpolating to fill in cells with no directional data (e.g., to define a direction field such as a direction field 502 of FIG. 5), and following trajectories that honor the directions (e.g., as described with respect to FIG. 3). In such an example, resulting trajectories can form a set of contour lines which, when assigned scalar values (see, e.g., FIG. 10) and assuming that these values represent elevations, define a surface which has the desired property that its strike direction is locally the same as that of the original directions of the directional data. As an example, an equalization technique (see, e.g., FIG. 11) may be implemented to modify one or more assigned scalar values, for example, to help ensure that a resulting surface has an even inclination along a dip direction. Such an approach can prove useful in terms of being a property of the surface as it can help to ensure minimal lateral distortion of the generated channels.

Figure 4:
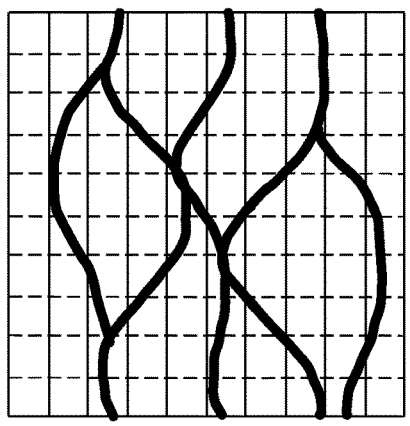
FIG. 4 illustrates an example of a spatially distributed variable, an example of a map and an example of a mapping of the spatially distributed variable with the map.
Figure 4:
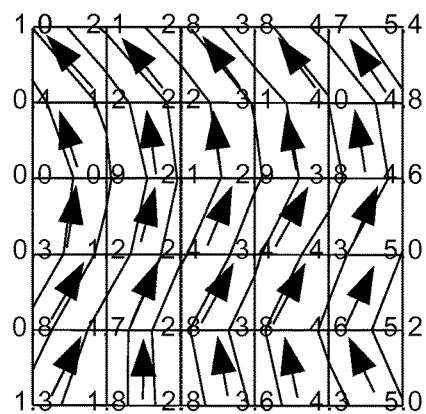
Figure 4:
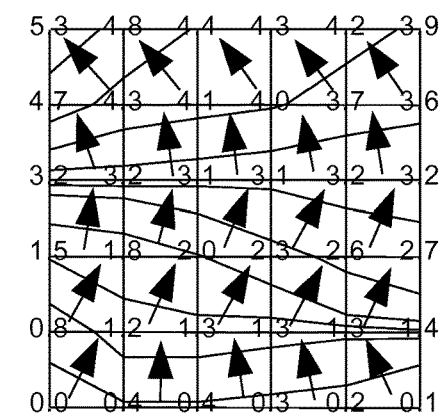
Figure 4:
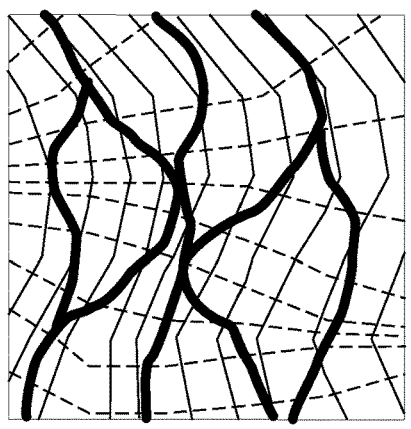

FIG. 4 shows an example of a spatially distributed variable 404 that may be mapped using a map 480 to output a mapped spatially distributed variable 408. In the example of FIG. 4, the spatially distributed variable 404 may be considered a model and the mapped spatially distributed variable 408 may be considered a refined model. In the example of FIG. 4, the thick lines may represent locations of a spatially distributed variable, for example, a variable that indicates position of a channel or other feature.

As to the map 480, it is shown as including a first set of scalar field values 440 and a second set of scalar field values 470. In the example of FIG. 4, the scalar field values are shown with respect to a grid that includes cells where each of the cells has been assigned a direction (e.g., a local direction). In the example of FIG. 4, the scalar field values are provided with respect to nodes of the grid where the values are determined based on the directions in the cells.

Also shown in FIG. 4 are lines traced across the grids where the lines for the first set of scalar field values 440 are oriented differently than the lines of the second set of scalar field values 470. The difference in orientation may stem from a rotation process such as that of the rotate block 350 of the method 300 of FIG. 3. As an example, the trace block 330 of the method 300 may provide the lines for determining the first set of scalar field values 440 and the trace block 360 of the method 300 may provide the lines for determining the second set of scalar field values 470. As indicated, the map 480 includes the two sets of scalar field values 440 and 470. As an example, scalar field values may be organized in an array or other data structure (e.g., where each node position is associated with two scalars).

FIG. 5 shows an example of a direction field 502 (e.g., of gradient directions) and a desired surface 504. As an example, a process can define a desired surface (e.g., represented by elevation values on a grid) based on information (e.g., a direction field) about the surface's dip direction (e.g., direction of steepest descent, relative to North) or strike direction (e.g., direction perpendicular to azimuth) at a discrete set of points, optionally without information as to magnitude (e.g., or absolute value). Such a process may include finding a scalar field from information about direction of gradient(s), for example, optionally without information as to absolute values of the gradient(s).

As an example, a method can include obtaining a surface whose gradient direction approximates desired values. As an example, a method can include defining a scalar field or fields from gradient directions. In such an example, the scalar field or fields may provide for effecting local rotations on spatial representations of one or more variables. For example, a method can include applying local rotations specified by a scalar field or fields to modify outcome of a model to honor locally observed variations in direction of anisotropy. As another example, a method can include restoring an image, in which local rotations of directions of anisotropy have been detected, to an image, for example, in which the directions of anisotropy are constant throughout the image.

As an example, a method can include building a curved surface from channel complex (e.g., channel fairway) directional data. Such a method may optionally provide for modeling stochastic channels through intersecting one or more random surfaces.

As an example, a method can include generating a surface that approximates given gradient directions. Such a method may include defining a rectangular two-dimensional grid and assigning a direction to each cell of the grid. Given such a grid with a direction in each cell, as an example, a method can include checking the direction data for inconsistencies such as loops, singularities, and certain types of discontinuities; defining a trajectory that follows the direction defined in each cell both forward and backward; following the trajectory with respect to a plurality of cells (e.g., from cell to cell until both ends reach a grid edge); storing points of intersection between the trajectory and the cell edges and intersection information as to whether each intersection is positive (e.g., to the left or up in two-dimensional grids) or negative (e.g., to the right or down in two-dimensional grids); starting at any arbitrary node with an arbitrary value (e.g., in a two-dimensional grid at the lower left, with a value of 0), following the cell edges and accumulating number (e.g., and sign) of intersection points; and assigning to each node, an accumulated number. In such an example, the value assigned to each node is a scalar that defines, at least in part, a desired field or surface. As an example, additional information may be associated with each node (e.g., a scalar and other relevant information). As an example, a method may optionally include remapping node values using a normalization procedure to reduce variation in absolute value of the gradient.

As an example, a method may include performing rotations in a field for purposes of generating a scalar field by rotating directions in cells of a grid by e.g., approximately 90 degrees and repeating actions such as defining a trajectory, following a trajectory, storing points of intersection and/or intersection information, following cell edges and/or accumulating number of intersection points, and/or assigning to each node, an accumulated number. If a first set of accumulated numbers is referred to as X and a second set of accumulated numbers is referred to as Y, then the X and Y values at each node define a one-to-one continuous mapping (e.g., form a node's position on the grid to a point defined by the X and Y coordinate values). Such a mapping may be applied to one or more spatially distributed variables to provide a new spatial distribution of the one or more variables. In such an example, features may be locally rotated by the X and Y values to conform to directions specified by directional data.

Referring again to FIG. 5, an assignment block 510 is shown with respect to a 2-D grid of cells 512 where each cell is assigned a direction 514. As an example, a method can include constructing a surface whose contours follow the directions indicated by the arrows in the 2-D grid of cells 512. While the grid 512 includes rectangular cells, as an example, a grid may include cells of another shape or shapes. Some examples are shown in block 522, which includes shapes such as triangular, hexagonal and other. In such examples, one or more rules as to crossings of edges of a cell may be defined, which may differ from those of cells with rectangular shape(s).

As an example, direction data may not be available for one or more cells of a grid. In such an example, a process may proceed without the direction data in those one or more cells, optionally by tracing to another cell, by interpolating based on direction data in one or more adjacent cells, etc. For example, consider a scenario where a direction is not provided for the last column, second row of the grid 512 and where directions are provided for the adjacent cells in the last column. In such a scenario, the missing direction may be determined as an average of the directions in the last column first row and third rows. Such an interpolation may be expanded, as appropriate, to include one or more other cell directions. Where direction data are sparse, a nearest neighbor interpolation may be implemented. In such an example, a process may mark interpolated cells, which may be optionally rendered to a display with highlighting, coloring, etc., to indicate that they have been interpolated and may possibly have greater uncertainty than other regions of a grid (e.g., or regions where directions were provided may be highlighted, colored, etc., when rendered to a display). Such processes may assist visual interpretation and decision making (e.g., as to modeling, simulation, etc.). As an example, a method may include stochastic filling where, for example, sparse data have been provided. As mentioned, stochastic filling may aim to provide a more natural character when compared to, for example, linear interpolation of spare data (e.g., consider sinuous nature of channels, etc.). Stochastically generated data may optionally be generated using one or more parameters, for example, that provide for scale, characteristics, etc., that may more closely approximate those found in nature (e.g., for channels or other features).

Figure 6:
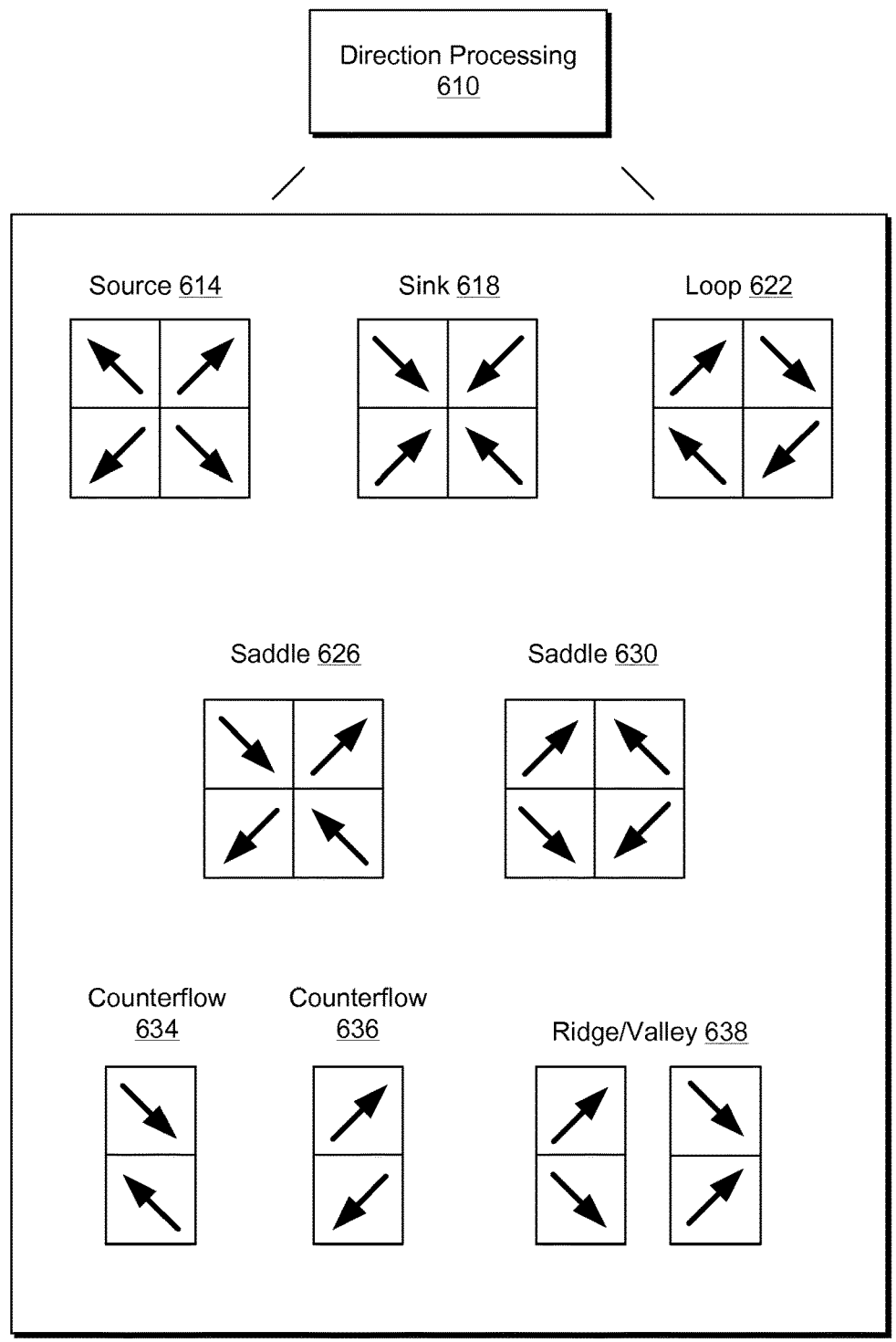
FIG. 6 illustrates an example of direction processing for processing directions in a two dimensional grid of cells.

FIG. 6 shows an example of a direction processing block 610 that can process direction data with respect to a grid of cells. As an example, the direction processing block 610 may process two or more cells of a grid with respect to one or more conditions, including, without limitation, a source condition 614, a sink condition 618, a loop condition 622, a saddle condition 626, a saddle condition 630, a counter flow condition 634, a counter flow condition 636, and one or more ridge/valley conditions 638. As an example, the direction processing block 610 may act to verify that the directions grid does not contain anomalies that would confound obtaining a solution. As an example, where a grid is composed of cells having shapes other than rectangular, direction processing may be adjusted based on suitable conditions (e.g., consider triangles, hexagons, etc.).

As to the source condition 614 and the sink condition 618, these can occur, for example, at a corner in which directions (e.g., which may be flow directions) in at least three of the four adjacent cells either point toward a quadrant of a central node or away from it. As to the loop condition 622, it can occur, for example, at a corner in which directions (e.g., which may be flow directions) in four adjacent cells point toward quadrants that form a clockwise or counterclockwise loop around a central node. As to the saddle conditions 626 and 630, these can, for example, represent a topographic saddle point where directions represent either azimuth directions (e.g., dip azimuth directions) or strike directions and may be subdivided into two types: two diagonally opposed cells whose directions point toward a quadrant of a central node and the other two point away; and two diagonally opposed cells whose directions point in a clockwise quadrant relative to a central node and where the other two cell directions point counterclockwise. As to counterflow conditions 634 and 636, these can occur, for example, when two adjacent cells contain directions pointing in opposite quadrants. Anomalies can sometimes be salvaged by changing a direction in one of the cells, changing directions in two or more cells, by applying a smoothing filter, or other process.

Figure 7:
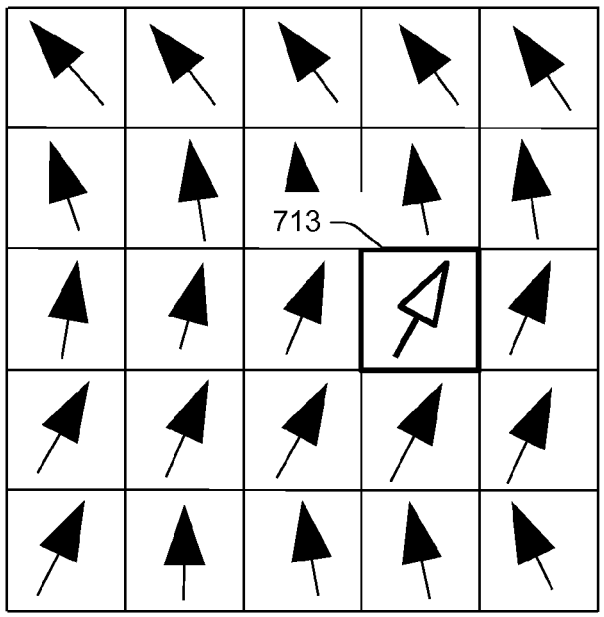
FIG. 7 illustrates an example of a method.
Figure 7:
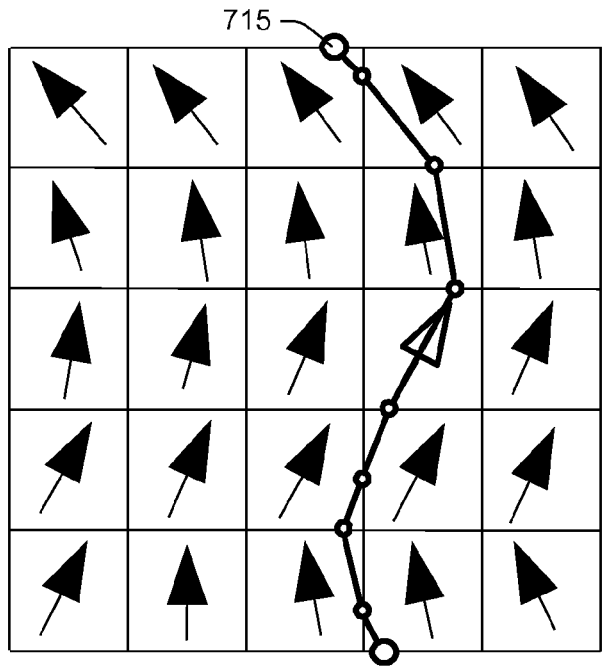
Figure 7:
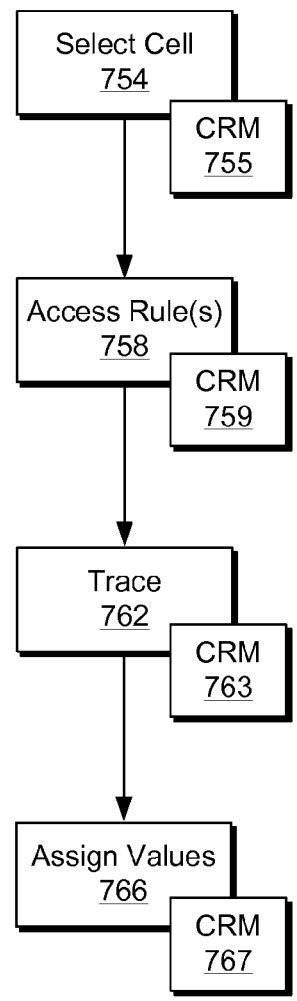

FIG. 7 shows an example of a grid of cells 712, an example of a direction 713 and a corresponding trace 715 and an example of a method 750. In the example of FIG. 7, the method 750 can include a selection block 754 for selecting a cell of a grid, an access block 758 for accessing one or more rules, and a trace block 762 for tracing a trace based at least in part on a direction of the selected cell while applying one or more of the accessed one or more rules. For example, considering the selected cell 713 and the trace 715, intersection points (open circles) are identified for which one or more rules may be applied. In such an example, application of the one or more rules may provide information for use in an accumulation process or other process that can determine scalar values for a scalar field.

As an example, a method can include picking a set of points (e.g., points corresponding to cell centers) and tracing a trajectory (e.g., a trace) from each of the points where the trajectory follows a direction of each point and any other relevant directions. Such a tracing process can occur forward with respect to a direction, backward with respect to a direction (e.g., 180 degrees) or forward and backward (e.g., depending on where a point/cell is located in a grid). As an example, a larger point set may be defined to increase resolution of the result (e.g., with accompanying processing demand). As an example, a method may process points on a point-by-point basis where computations for each point are completely independent of computations for other points. As an example, such a method may optionally be implemented using parallel computing where computations for multiple points are performed in parallel (e.g., a parallel processing algorithm).

As an example, starting at the center of the cell 713 that contains the open-ended arrow, a piecewise linear trajectory (e.g., piecewise linear trace) can be drawn from cell to cell. As shown in the example of FIG. 7, in each cell, the trajectory is aligned with the direction of that cell. Tracing of a trajectory can occur forward and backward from a starting point until a grid edge is reached going forward and another grid edge is reached going backward (e.g., see large open circles of the trace 715 at edges of the grid of cells 712).

The method 750 is shown in FIG. 7 in association with various computer-readable media (CRM) blocks 755, 759, 763, and 767. Such blocks generally include instructions suitable for execution by one or more processors (or cores) to instruct a computing device or system to perform one or more actions. While various blocks are shown, a single medium may be configured with instructions to allow for, at least in part, performance of various actions of the method 750. As an example, a computer-readable medium (CRM) may be a computer-readable storage medium.

As an example, one or more computer-readable storage media can include computer-executable instructions to instruct a computing device to: select a cell of a two dimensional grid of cells that includes a direction (see, e.g., the block 755); access one or more rules (see, e.g., the block 759); perform a trace with respect to the two dimensional grid of cells based on the direction (see, e.g., the block 763, which includes tracing a trace across the two dimensional grid of cells based on the direction); and assign values to intersection points between the trace and edges of the cells according to at least one of the one or more rules (see, e.g., the block 767). As to an example of rules, if a trace intersects an edge in a direction of up or left, a value of approximately +1 may be assigned to that intersection point; whereas, if the trace intersects an edge in a direction down or right, a value of approximately −1 may be assigned to that intersection point. As an example, such assigned values for a two dimensional grid may be used for determining scalar field values for the two dimensional grid. As an example, such scalar field values may be values for a map. Thus, the values of a map may be based on a selection of one or more rules (e.g., for intersection points based on directions).

Figure 8:
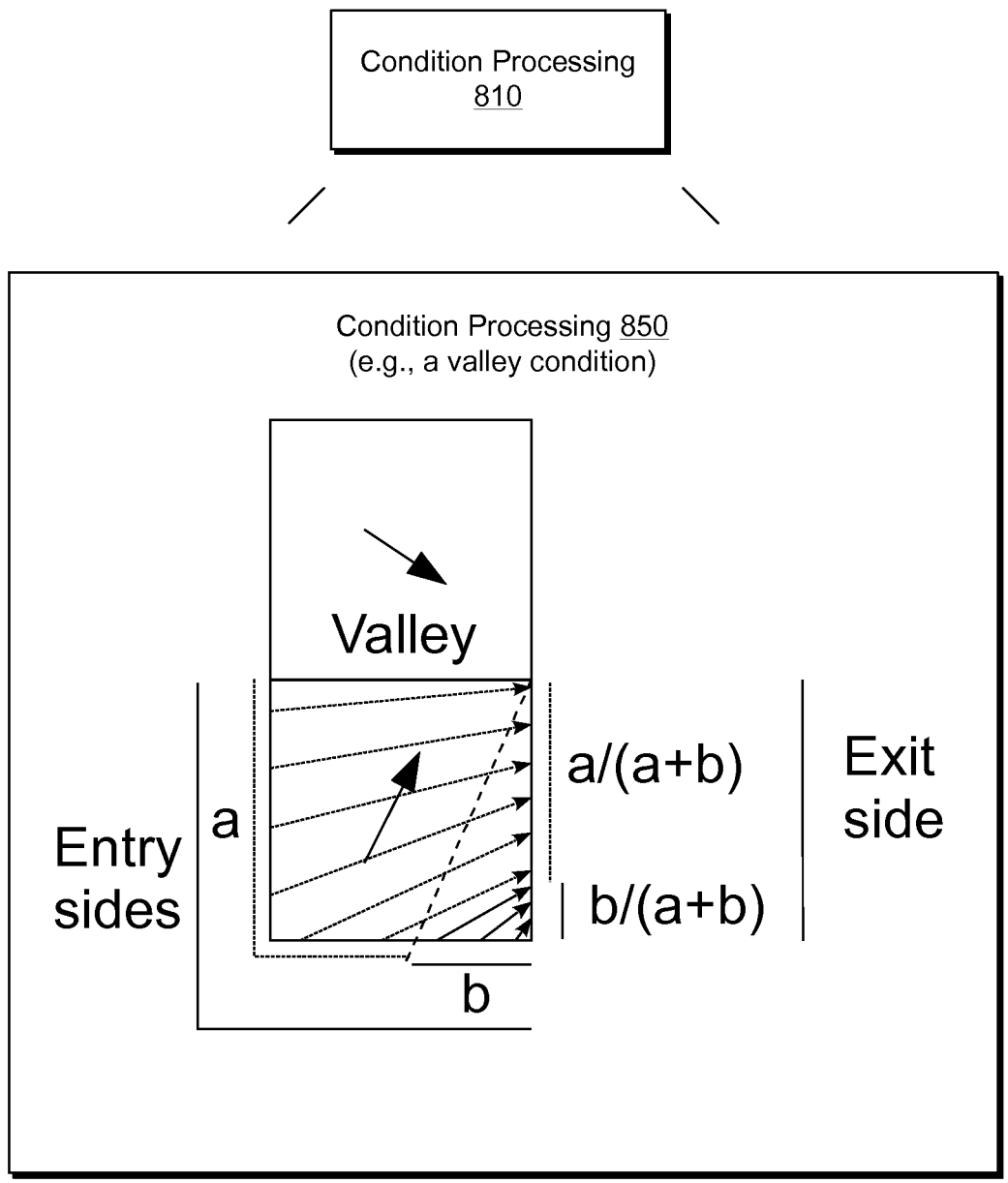
FIG. 8 illustrates an example of condition processing for processing a condition that exists for two or more directions in a grid of cells.

FIG. 8 shows an example of a condition processing block 810 and condition processing 850 with respect to a valley condition (see, e.g., the condition 638 of FIG. 6). In the example of FIG. 8, when direction processing (see, e.g., FIG. 6) encounters a ridge or valley condition, condition processing may be implemented (e.g., per the condition processing block 810). Such a process can address a scenario where a trajectory reaches an edge of a cell where an adjacent cell includes a direction that points toward that same edge. This scenario can occur for: valleys, in which directions in two adjacent cells point toward a common edge (e.g., but their projections onto the edge point in the same direction along the edge); and ridges, in which directions in two adjacent cells point toward a common edge (e.g., but their projections onto the edge point in the same direction along the edge).

In the case of a valley, the condition processing 850 can provide a check that a common edge is not crossed by a trajectory (e.g., a trace). Of the other three sides of the cell, the direction of the cell will determine two that are crossed inwards and one outward, by any trajectory that reaches these sides, called entry and exit sides respectively. In a valley, the side opposite to a common side (e.g., common edge of the two cells) is shown to be an entry side. A straight line drawn in the cell's direction passing through one of the end points of the segment that forms the common edge will intersect one of the entry sides (see, e.g., dashed line in FIG. 8). As shown, the intersection point divides the joint length of the entry sides into two parts: a and b. In the example of FIG. 8, the exit side is then divided into two segments with the same ratio as a to b. Then points in one of the entry sides (e.g., every point in one of the entry sides) can be matched to a point in the exit side by prorating its position, as shown in the example of FIG. 8. The condition processing 850 provides a mechanism to draw trajectories (e.g., traces) through cells that are adjacent to valleys. As to a scenario involving a ridge, arrow directions shown in FIG. 8 may be reversed.

Figure 9:
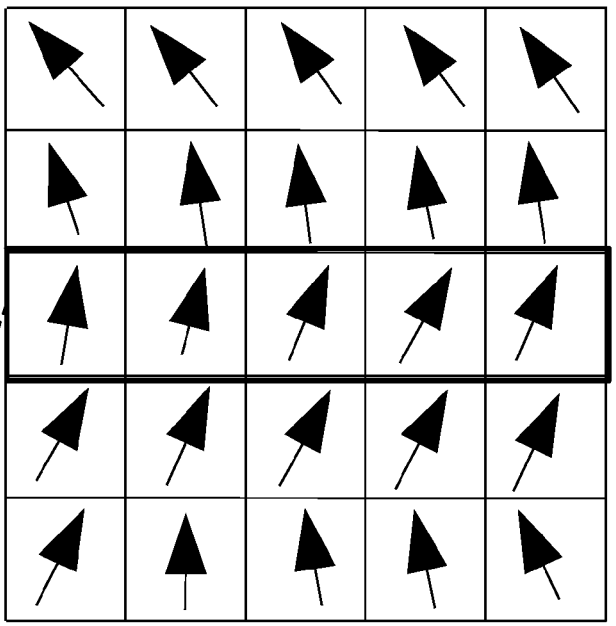
FIG. 9 illustrates an example of rules for application to traces across a two dimensional grid.
Figure 9:
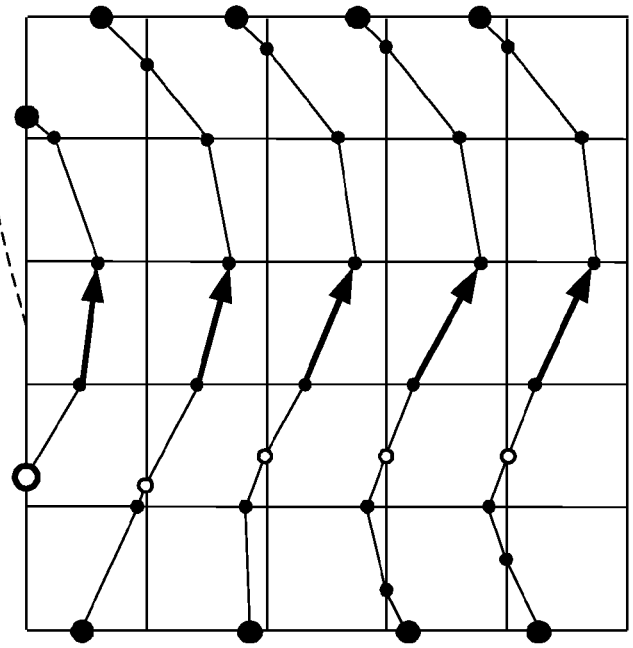

FIG. 9 shows an example of a grid of cells 912, a selected row 914 in the grid 912 and traces 916 through the grid 912 that correspond to the selected row 914. In the example of FIG. 9, an example of a rules block 950 is also shown as including an "up or left" rule and a "down or right" rule. For purposes of description, the rules are shown as being applied graphically by a solid circle and an open circle.

In the example of FIG. 9, intersection points between trajectories (e.g., traces) and cell edges may be stored to a storage device (e.g., in an array or other data structure). In such an example, a method may also include storing direction in which a line crosses a cell edge. As indicated by the rules block 950, a convention may be implemented such that when a trajectory (e.g., a trace) crosses a horizontal cell edge upwards, the crossing is deemed to be positive (e.g., and downwards, negative) and when it crosses a vertical cell edge to the left, the intersection is deemed to be positive (e.g., and to the right, negative). By repeating such a method for a number of starting points, a set of intersection points can be obtained. FIG. 9 shows an example of intersection points for five trajectories (e.g., traces) corresponding to center points of five cells in the row 914. As an example, more points may be used. In the example of FIG. 9, as center points of cells of the grid 912, which is a 5×5 grid, are used, 25 trajectories (e.g., traces) are generated.

Figure 10:
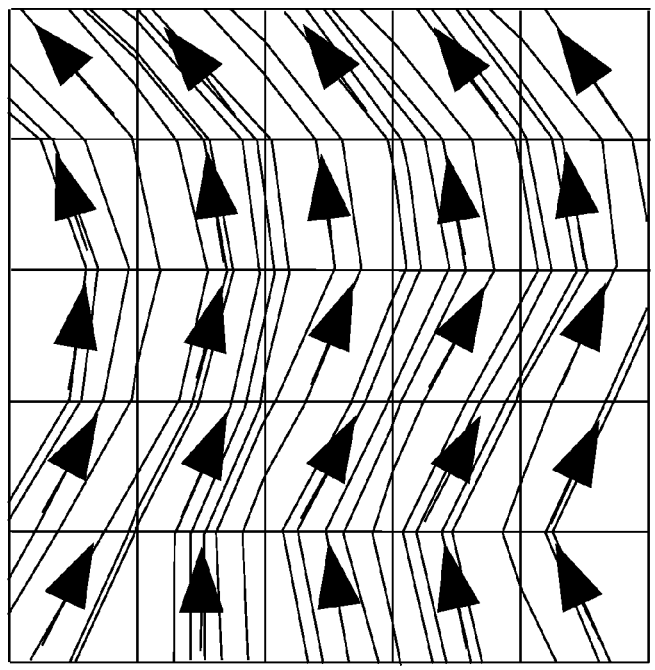
FIG. 10 illustrates an example of a method for determining scalar field values.
Figure 10:
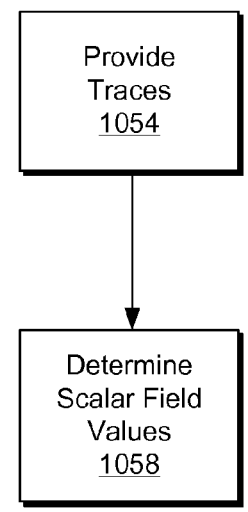

FIG. 10 shows an example of traces of a grid of cells 1012, an example of scalar field values 1016 and an example of a method 1050 for determining scalar field values based at least in part on provided traces. In the example of FIG. 10, 25 traces are shown within the grid of cells. As described with respect to the example of FIG. 9, a 5×5 grid where one point (e.g., a center point) is considered for each of the 25 cells of the grid, 25 traces may be generated. As to the method 1050, it can include a provision block 1054 for providing traces and a determination block 1058 for determining scalar field values based at least in part on the provided traces.

As an example, traces can define a set of intersection points and, given the set of intersection points, an accumulation process can accumulate values associated with each of the intersection points. For example, an accumulation process may accumulate intersection point values (e.g., using +1 as positive per rules and −1 as negative per rules). In such an example, the accumulation process may commence at a selected node (e.g., cell corner), for example, the bottom left of the grid (e.g., node 0, 0) may be selected as a starting node for purposes of the accumulation process. As an example, an arbitrary scalar value (e.g., 0) may be assigned to a starting node of an accumulation process.

As an example, an accumulation process may determine a sum of values of intersection points on one cell edge to obtain a number that represents a "step" between scalar values of two adjacent nodes. Such a step is a difference or a gradient between the scalar values of the two adjacent nodes. Thus, by moving from a node one cell edge to the right of that node, the next node's value will be the initial node value plus the sum of the intersection-point values encountered along the way. Similarly, moving to the left, a new value is an original minus the sum of the intersection points encountered along the way. Further, moving up one cell edge, a new node value is that of the previous node plus the sum of the intersection points along the path and, moving down, it is that of the previous node minus the sum of the intersection-point values. In such an example, values can be generated for the nodes of a grid where values determined for the nodes can be independent of the path followed (e.g., path independent values). For example, one may start at a left edge of a grid from a bottom up to fill a first column, and then traverse each row from left to right to fill remaining node values.

In the example of FIG. 10, scalar field values 1016 are shown that correspond to the method 1050 being applied to the traces for the grid of cells 1012 (e.g., for the example rules 950 of FIG. 9). In the example of FIG. 10, the scalar field values 1016 may represent elevation values of a surface whose contour lines (e.g., alternatively local strike directions) closely approximate the traces 1012. In the example of FIG. 10, the scalar field values 1016 are integers (e.g., due to accumulation of whole intersection points). As an example, an accumulation or determination process may use distance between a node and its nearest intersection points to interpolate a floating point value.

As an example, a scalar field can approximate a desired field of strike directions; however, it may represent one of various possible solutions. For example, a linear transformation (e.g., addition of a constant and/or multiplication by a factor) of node values can results in another solution; however, a change in a surface's steepness between two contour lines can also result in another solution. For example, if a surface has elevation values at its nodes that range from 0 to 10, it is possible to determine another solution by mapping the range (0, 1) into the range (0, 5), and the range (1, 10) in to the range (5, 10). In such an example, steepness of a new surface will vary from an original; yet, dip directions and strike directions will not.

Figure 11:
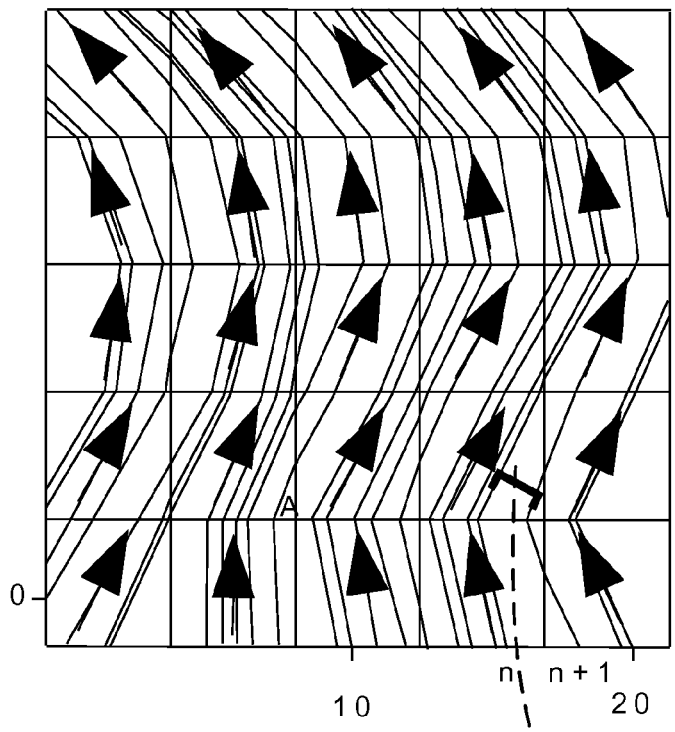
FIG. 11 illustrates an example of a method for adjusting traces in a two dimensional grid.
Figure 11:
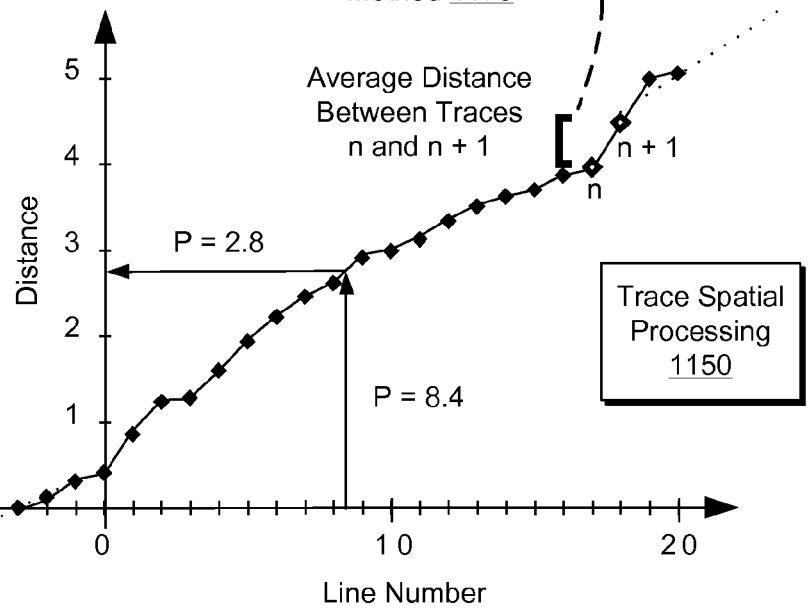

FIG. 11 shows an example of traces for a grid of cells 1112, an example of a trace spatial processing block 1150 and a graphical representation of a trace spatial processing method 1170.

As an example, it may be desirable to produce a surface whose contour lines are approximately equally spaced. That is, a surface that has the desired slope directions but whose steepness (e.g., or slope absolute values) are approximately uniform. Consider the existence of correctable effects where, for example, such effects may cause a surface contour lines (e.g., represented by the traces) to be spaced unevenly.

As an example, consider a large scale effect. Such an effect may exist where, if traces are started at a plurality of cell centers (e.g., every cell center), traces that pass through more cells will be more closely spaced because, at each cell center, another line will have been added. For example, consider a scenario where cell directions point 45 degrees clockwise from North. In such a scenario, close to the main diagonal (i.e., on a line from Southwest to Northeast passing through the center of the grid), there will be many traces per cell; whereas, on the corners away from the diagonal (i.e., Northwest and Southeast corners), there can be considerably fewer traces per cell.

As another example, consider a small-scale effect. Such an effect may exist because of the way traces are generated (e.g., parallel within each cell) such that unevenness in spacing between adjacent traces tends to persist along the entire length of adjacent traces.

As to the aforementioned large scale effect, it may be addressed, for example, by weighing each intersection point along a trace by the inverse of a number of cells the trace traverses. In such an example, instead of assigning a value of approximately +1 or approximately −1 to intersection points, a trace that traverses 5 cells may be assigned a value of approximately +0.2 or approximately −0.2 to its intersection points.

As to the aforementioned small scale effect, it may be addressed, for example, by spatial processing, as graphically illustrated by the method 1170 of FIG. 11. Such a method can include finding an average horizontal distance between adjacent traces, representing these distances in a graph in which the abscissa (x axis) represents an (evenly spaced) trace number and an ordinate (y axis) for the accumulated distances, using the graph to map scalar values (e.g., from the x axis into the y axis), and optionally extending the graph by extrapolation in both directions to cover areas in the grid that fall beyond the lowest or highest contour.

As an example, consider a distance between the traces n and n+1 as having a distance, which forms part of the graph of distance versus line number. When various distances are graphed, the resulting line may be used for adjusting contours. Using such a graph, consider a point P as having a value of approximately 8.4, which may be adjusted (e.g., spatially adjusted) to an adjusted value of approximately 2.8. As an example, consider the traces for the grid cells 1112 being spatially processed to provide the traces of the scalar field values 440 of the map 480 of FIG. 4; noting that the traces of the scalar field values 440 appear evenly spaced in comparison to the traces for the grid cells 1112.

As an example, a method can produce a scalar field represented by a surface with desired strike directions. As an example, a method may be implemented to obtain a set of lines that follow dip directions (e.g., based on dip azimuth), which, like contour lines, are continuous and do not intersect one another. Such a method may be useful, for example, in modeling overland drainage patterns, oil migration along impermeable surfaces or other flow related patterns, surfaces, etc. As an example, a method can include starting with directions that represent dips (e.g., dip azimuths) rather than strikes (e.g., strike azimuths rotated approximately 90 degrees relative to the dip azimuths). For example, consider again the scalar field values 440 and 470 of FIG. 4, which are each shown with corresponding traces. In the example of FIG. 4, the scalar field values 470 and the traces shown with respect to those values correspond to directions of the scalar field values 440 (see arrows for the cells) as having been rotated e.g., approximately 90 degrees (i.e., noting that the arrows are shown as provided, without rotation).

Referring again to various effects and techniques to address such effects, a method may include equalizing distances of traces along one of their perpendiculars. Such a method can result in a selected perpendicular line having a constant gradient in an original field. Such a method may also result in that the new "cells" or quadrilaterals defined by two consecutive traces (see, e.g., the traces in the scalar field values 440 of FIG. 4) and two consecutive rotated traces (see, e.g., the traces in the scalar field values 470 of FIG. 4) would have approximately the same aspect ratio along a trace.

For example, a method can include finding a scalar surface whose contour lines represent provided directions rotated e.g., approximately 90 degrees. If the scalars values obtained from provided strike directions are called X (see, e.g., the scalar field values 440 of FIG. 4) and the scalar values obtained from dip directions are called Y (see, e.g., the scalar field values 470 of FIG. 4), then the mapping from original node positions to positions represented by X and Y at each node is a continuous two-way mapping that locally rotates a selected property represented by the grid. In such an example, rotations may be given by strike directions relative to North.

As an example, where a geostatistical technique lacks a means to introduce local rotations or in which introducing rotations may be computationally expensive, a method such as the method 300 of FIG. 3 may be employed to apply rotations. In such an example, hard and soft data that are honored by the technique can still be honored by applying an inverse mapping to the hard and soft data before modeling. As another example, when performing object modeling where certain angular relations between objects are to be specified, a method such as the method 300 of FIG. 3 may be implemented for local rotations. For example, when modeling braided channels, certain braiding patterns may be specified to be honored, in such an example, a method may perform local rotations such that an entire set of braided channels conforms to a local valley shape.

As an example, a method may be implemented that includes generating a map based at least in part on directions (e.g., a direction field) and applying the map to transform braided channels. Referring again to the example of FIG. 4, the spatially distributed variable 404 may represent braided channels. A method may include generating a map for the braided channels based on a provided direction field and then applying the map to output mapped or transformed braided channels, for example, the mapped spatially distributed variable 408 may represent mapped or transformed braided channels.

Figure 12:
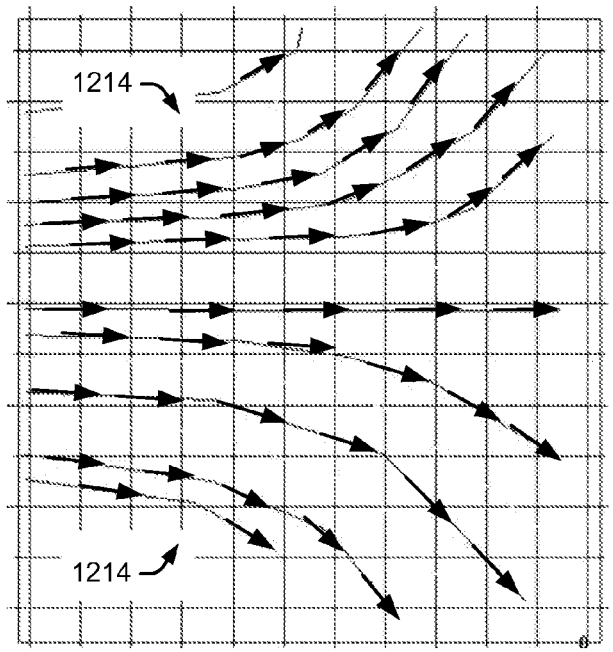
FIG. 12 illustrates an example of a direction field, an example of a channels model, an example of a mapped channels model, and an example of a method.
Figure 12:
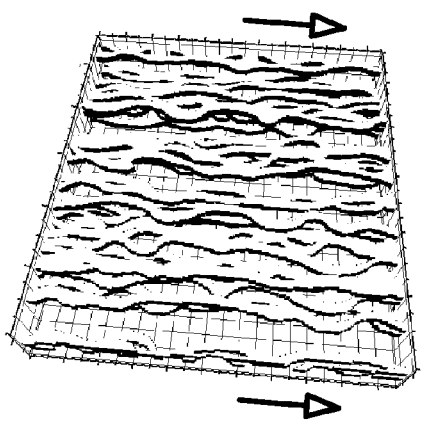
Figure 12:
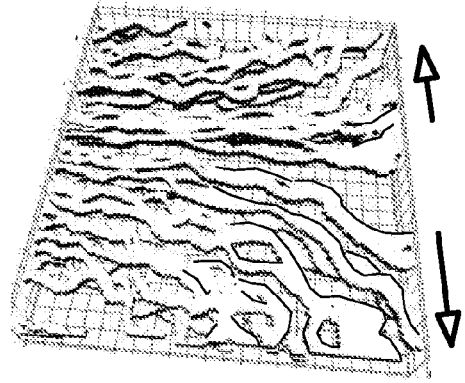
Figure 12:
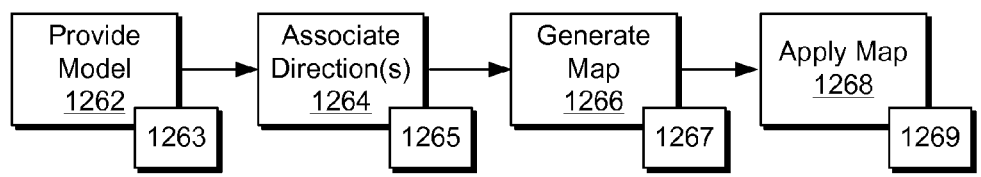

FIG. 12 shows an example of a direction field 1212 for a 2-D grid, an example of a channels model 1222, an example of a mapped channels model 1232 and an example of a method 1260. In the example of FIG. 12, the channels model 1222 includes channels modeled as having relatively uniform directions; whereas, the mapped channels model 1232 includes channels modeled as having directions that deviate, for example, due to a ridge, lithology, etc.

As to output of a mapped model, as an example, a user may select field data for presentation to a display where a cursor may be manipulated and used to mark points. In such an example, marked points may define lines, for example, representing various potentials. In turn, the lines may be used as a basis for determining directions with respect to cells of a 2-D grid.

In the example of FIG. 12, the direction field 1212 includes lines in an x,y-plane where directions 1214, shown by arrows, are determined based at least in part on the lines. In such an example, the arrows represent direction without regard to magnitude. Such direction data may be provided to generate a map for performing, for example, local rotations within a model (e.g., to refine the model, output a mapped model, etc.). When the directions 1214 (e.g., direction data) is provided to generate a map, which is applied to the model 1222, the mapped model 1232 may be output. As shown in FIG. 12, the mapped model 1232, by application of such a map, includes channels that deviate outwardly when compared to the model 1222 (e.g., which may be considered a base model).

As shown in the example of FIG. 12, the method 1260 includes a provision block 1262 for providing a model (e.g., a base model), an association block 1264 for associating one or more directions, a generation block 1266 for generating a map, and an application block 1268 for applying the generated map. Such a method may be implemented where the model 1222 and the directions 1214 are provided and a generated map, based at least in part on the directions 1214, is applied to the model 1222 to output the model 1232.

The method 1260 is shown in FIG. 12 in association with various computer-readable media (CRM) blocks 1263, 1265, 1267, and 1269. Such blocks generally include instructions suitable for execution by one or more processors (or cores) to instruct a computing device or system to perform one or more actions. While various blocks are shown, a single medium may be configured with instructions to allow for, at least in part, performance of various actions of the method 1260. As an example, a computer-readable medium (CRM) may be a computer-readable storage medium.

As an example, a map may be applied to transform an image where local scale and aspect ratio are altered for at least some points of the image (e.g., when comparing a transformed image to a base image). As an example, a method can include performing an equalization process, which may act to minimize such scale and aspect ratio distortions globally. As another example, a method can include equalizing along a line (see, e.g., FIG. 11) such that at least some aspect ratio distortions may be reduced along that line.

As an example, a method may be applied to "unrotate" (e.g., or restore to an unrotated state) one or more images in which local rotations have been detected, for example, with the purpose of using the one or more images as training images in a geostatistical or an image recognition process in which uniformity of anisotropy directions may be beneficial. As an example, a method that includes rotation analysis (e.g., unrotation or rotation characterization) may recover scales, fractal dimensions, sinuous characteristics, etc., which may, for example, be applied for filling in sparse data or for another purpose.

Figure 13:
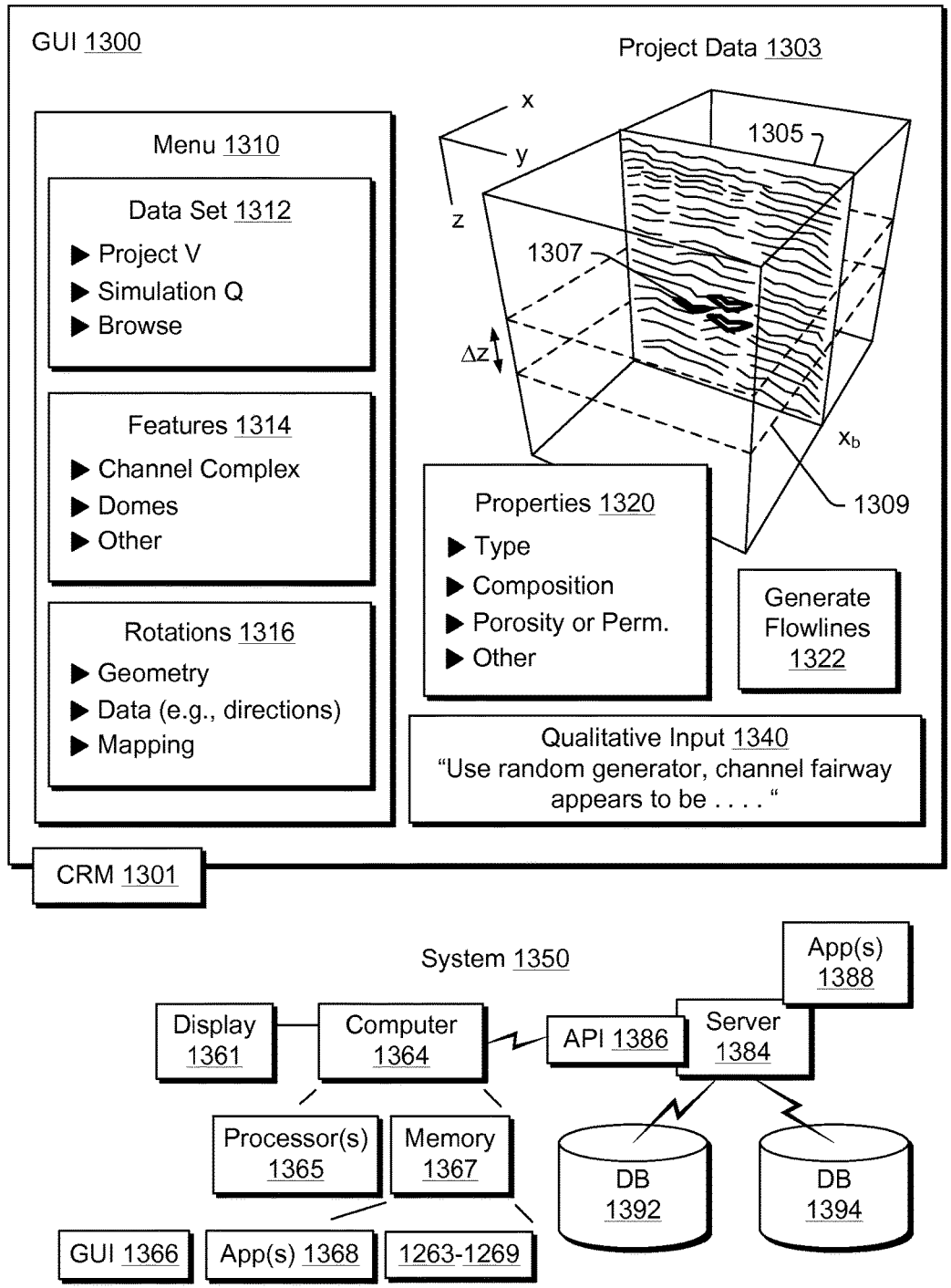
FIG. 13 illustrates an example of a graphical user interface and an example of a system.

FIG. 13 shows an example of a graphical user interface (GUI) 1300 and a system 1350. The GUI 1300 may include a region for presentation of project data 1303, for example, where a slice 1305 may be rendered to a display to identify features 1307 (e.g., channels, etc.) and, for example, where a slice thickness 1309 may be selected orthogonal to the slice 1305 for purposes of processing to enhance representation of the features 1307 (e.g., within a model).

As an example, data flattening may occur for a slice having a thickness to provide information with respect to a 2-D grid. One approach to flattening can involve a so-called minimum intensity voxelation or minimum intensity pixelation. In such an approach, a channel complex (e.g., channel fairway) may be flattened to a 2-D representation of information with respect to a grid of cells. Such a 2-D representation may be considered a model, for example, with respect to coordinate points that define the channels of the channel complex with respect to one or more underlying spatially distributed property values. Where direction data can be provided for such a model, a map may be generated for spatially mapping the spatially distributed property values to output a mapped, refined or updated model. In turn, in the example of FIG. 13, the output model or map may be applied to data such as the project data 1303. As another example, the output model may be part of a simulation model or may be used to form or adjust a simulation model (e.g., for flow simulation, etc.).

Referring again to the GUI 1300, as shown in FIG. 13, it can include a menu 1310 for items such as data sets 1312, features 1314, rotations 1316. The GUI 1300 may be provided as processor executable instructions stored in a computer-readable storage medium (e.g., CRM) where the instructions are executable by a processor to generate output and to receive input (e.g., via a CPU, GPU, etc.).

As an example of a workflow, consider a user selecting a project from the data set items 1312, selecting channel(s) or a channel complex as a feature from the features items 1314, and then selecting various entries from the rotations items 1316 for performing rotations with respect to spatially represented channel information of the selected project. The example GUI 1300 also shows a properties graphic 1320, for example, to allow a user to select one or more types of properties, composition, porosity, permeability or other. Such properties may be for purposes of rendering information to a display, for purposes of selecting a spatially distributed variable for rotations, etc.

The example GUI 1300 also includes a generate flowlines graphic 1322, for example, to generate flowlines with respect to data, a model, etc. As an example, a user may generate a map, or access a map, and then apply the map to data, a model, etc., and then select the generate flowlines graphic to generate flowlines to the data, the model, etc., to which the map was applied. In such an example, a user may then visual the generated flowlines to assess whether the map was beneficial, whether to adjust a map, etc. In such an example, the generated flowlines may be assessed to see if they correspond to flowlines that may be expected, for example, according to flow dynamics, channel generation, history, etc. As mentioned, certain types of geological processes can give rise to channel complexes and flowlines may be expected to honor those processes.

As an example, the GUI 1300 can include a qualitative input graphic 1340 for input of qualitative information, which may be associated with a rotational mapping effort. For example, a user may input information as to aspects of a model, direction data, geophysics, fluid dynamics, etc. Such information may be beneficial and optionally shared with other users that encounter similar features, etc.

As an example, as to the project data 1303, processing may occur for a number of 2-D slices, which may be parallel, orthogonal, etc. In such an example, a 3-D map may be generated based at least in part on two or more 2-D maps. In such an example, 3-D map may be a stack of 2-D maps that can be applied to transform one or more spatially distributed variable. For example, consider 2-D maps for slices in the y,z-plane, 2-D maps for slices in the x,y-plane, 2-D maps for slices in the x,z-plane, 2-D maps for slices offset at an angle to an x,y,z coordinate system, etc. Selection of planes may depend, for example, on availability of direction data, which may stem from one or more sources (e.g., measured, generated, measured and generated, etc.).

In the example of FIG. 13, the system 1350 includes a display 1361 operatively coupled to a computer 1364 that can execute one or more applications 1368 and one or more associated graphical user interfaces 1366. As an example, the computer 1364 may be in communication with a server 1384, which can access one or more databases 1392 and 1394. In the example of FIG. 13, the server 1384 is shown as including an application programming interface (API) 1386, which may be implemented per specifications that allow for transmission of a call instruction to the server 1384 to call for data where the server 1384 can parse the call instruction to perform a location operation for certain data and, if the data is located, transmit the data back to the caller (e.g., via one or more networks). The server 1384 may include an ability to execute one or more applications 1388, for example, which may optionally be associated with one or more of the applications 1368. In the system 1350, one of the one or more applications 1368 or one of the one or more applications 1388 may include instructions, for example, to generate a map based at least in part on direction data. As an example, one database may include model information and another database may include direction information (e.g., direction data). In such an example, an application may access both databases to generate a map (e.g., for local, global, local and global rotations, etc.).

In the example of FIG. 13, the system 1350 can include one or more processors 1365, memory 1367, computer-executable instructions stored in the memory 1367 for execution by at least one of the one or more processor 1365 to: provide a model that includes a spatially distributed variable associated with a geologic environment (see, e.g., block 1263 of FIG. 12), associate one or more direction with a region of the model (see, e.g., block 1265 of FIG. 12), generate a map that includes scalar field values for the region (see, e.g., block 1267 of FIG. 12) and apply the map to the region of the model to redistribute the spatially distributed variable (see, e.g., block 1269 of FIG. 12).

As an example, the GUI 1300 may be a user interface implemented as one of the user interfaces 188 of the framework 170 of FIG. 1, may be a user interface implemented with the analysis/visualization component 142 of FIG. 1, or may be implemented as part of another component, block, etc. In the example of FIG. 13, the project data 1303 may optionally be or include seismic data (see, e.g., the seismic data 112 of FIG. 1).

Figure 14:
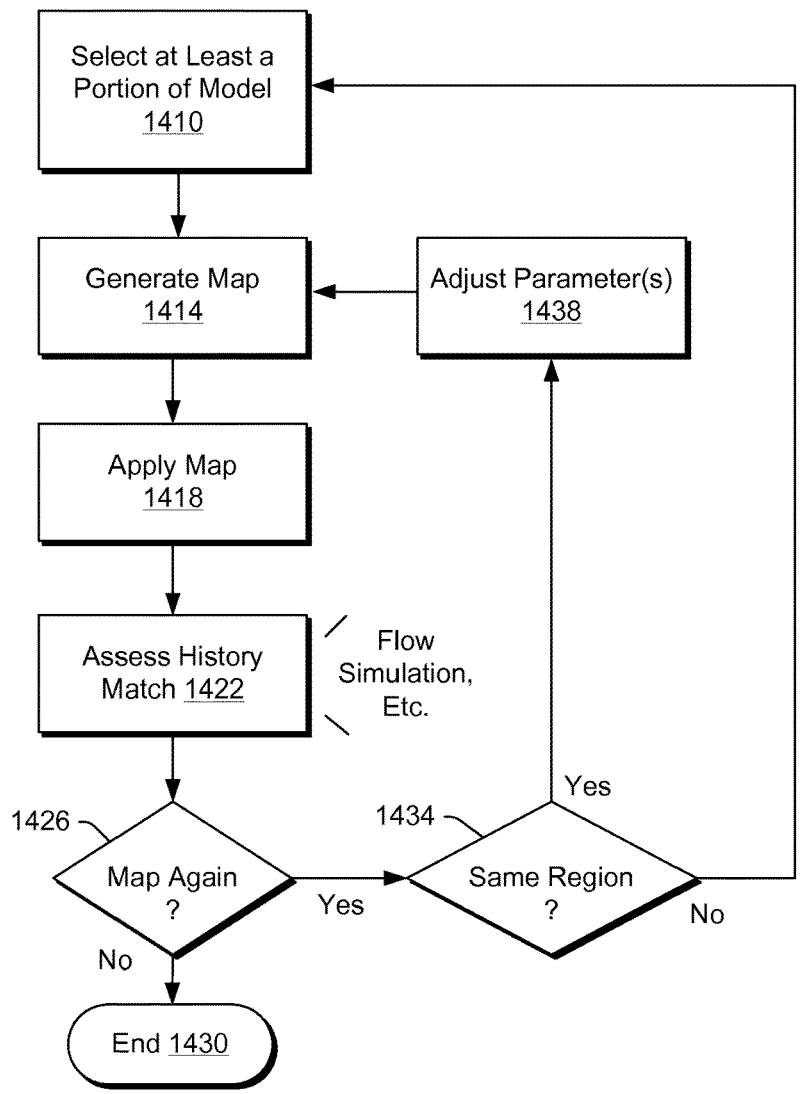
FIG. 14 illustrates an example of a method.

FIG. 14 shows an example of a method 1400 with respect to a model 1402, field data 1404, simulation data 1406 and history matching 1408. In the example of FIG. 14, the method 1400 includes a selection block 1410 for selecting at least a portion of a model, a generation block 1414 for generating a map, an application block 1418 for applying a generated map, an assessment block 1422 for assessing a history match for the model (e.g., via flow simulation, etc.), a decision block 1426 for deciding whether to map again (e.g., repeat at least part of a map generation process, a map application process, etc.), and an end block 1430, for example, to terminate the method 1400 (e.g., and return to some other functional process).

In the example of FIG. 14, where the decision block 1426 decides to map again, the method 1400 continues to another decision block 1434, which decides whether the map again process is to be applied to the region that was mapped (e.g., same region) or another, different region. Where the decision block 1434 decides that mapping is to be applied to another, different region, the method 1400 continues to the selection block 1410. However, if the decision block 1434 decides that mapping is to be applied to the same region, then the method 1400 continues to an adjustment block 1438 where one or more parameters (e.g., parameter values, etc.) are adjusted. After adjustment, the method 1400 continues to the generation block 1414 where another map can be generated that can account for the adjustment to at least one of the one or more adjusted parameters.

In the example of FIG. 14, the adjustment block 1438 may act to make one or more adjustments to enhance history matching, for example, to achieve a model with a better match to some historical data. For example, if the generation block 1414 generated a map based in part on data stemming from a random number generator, new data may be randomly generated for a new map where the new map is applied to the selected portion (e.g., region) of the model 1402 per the application block 1418 and history matching assessed per the assessment block 1422.

As another example, the adjustment block 1438 may allow for user adjustment to one or more directions in a direction field, for example, to fine tune direction data. In turn, the generation block 1414 may generate a new map where the new map is applied to the selected portion (e.g., region) of the model 1402 per the application block 1418 and history matching assessed per the assessment block 1422. In such an example, a user may possibly achieve a better history match for a model (e.g., the model 1402). As mentioned, history matching may involve simulating to provide simulation data and then comparing that data to, for example, measured data for an actual field (e.g., a reservoir modeled by the model).

In the example of FIG. 14, the application block 1418 may be applied to a fine model or an upscaled model. As an example, where it is applied to an upscaled model, the upscaled model may be readily transformed by the map and history matching assessed without a need to return to a fine model from which the upscaled model was upscaled. Such a process may benefit history matching, locally, globally, or locally and globally. As an example, such a process may optionally involve local mapping of one or more spatially distributed variables without mapping of any node, cell, etc., of a model. In such an example, a model grid (e.g., a simulation grid) may be preserved while one or more maps are applied to one or more spatially distributed variables (e.g., for the purpose of history matching or another purpose).

As an example, a method can include defining a two dimensional grid of cells for a region associated with a geologic environment, assigning directions to at least some of the cells, tracing a first set of trajectories with respect to the grid based on the directions (e.g., across at least a portion of the grid based on the directions), determining a first set of scalar field values based on the first set of trajectories, rotating the directions, tracing a second set of trajectories with respect to the grid based on the rotated directions (e.g., across at least a portion of the grid based on the directions), determining a second set of scalar field values based on the second set of trajectories, outputting a map based on the first set of scalar field values and the second set of scalar field values and applying the map to map a spatially distributed variable in the region associated with the geologic environment. Such a method may also include rendering a view of the spatially distributed variable to a display and rendering a view of the mapped spatially distributed variable to the display. As an example, a method can include mapping a spatially distributed variable associated with one or more channels.

As an example, a method can include rotating each of the provided directions by e.g., approximately 90 degrees. As an example, provided directions may include strike directions or dip directions. As an example, a method can include rotating provided directions such that the directions become dip directions (e.g., for strike directions rotated by approximately 90 degrees) or strike directions (e.g., for dip directions rotated by approximately 90 degrees).

As an example, a method can include simulating flow in a region using a simulation model and a mapped spatially distributed variable to generate simulation results. Such a method may include performing history matching for the simulation model based at least in part on the simulation results and measured data acquired from a modeled geologic environment (e.g., where the simulation model models at least a portion of the geologic environment). As an example, such a method may include adjusting the directions and outputting an adjusted map.

As an example, a system can include one or more processors, memory, and computer-executable instructions stored in the memory for execution by at least one of the one or more processor to: provide a model that includes a spatially distributed variable associated with a geologic environment, associate one or more directions with a region of the model, generate a map that includes scalar field values for the region, apply the map to the region of the model to redistribute the spatially distributed variable. In such a system, the model may be a model of a region of the geologic environment. As an example, a model may be a model of a region of a geologic environment that includes one or more channels.

As an example, a system may be configured to determine scalar values by accumulating values associated with intersections between cell boundaries of a two-dimensional grid of cells and traces with respect to the two-dimensional grid of cells based on the directions (e.g., across at least a portion of the two-dimensional grid of cells based on the directions). In such a system, each of the cells can include one of the directions.

As an example, one or more computer-readable storage media can include computer-executable instructions to instruct a computing device to: select a cell of a two dimensional grid of cells that includes a direction, access rules, perform a trace with respect to the two dimensional grid of cells based on the direction (e.g., trace a trace across the two dimensional grid of cells based on the direction), and assign values to intersection points between the trace and edges of the cells according to the rules. Such an example may include instructions to instruct a computing device to iteratively select each cell in the two dimensional grid of cells that includes a direction.

As an example, one or more computer-readable storage media can include computer-executable instructions to instruct a computing device to select two or more cells in the a dimensional grid of cells where each of the two or more cells includes a direction and to trace simultaneously traces with respect to the two dimensional grid of cells for the selected two or more cells (e.g., across at least a portion of the two dimensional grid of cells). In such an example, the instructions to instruct a computing device to trace simultaneously can include instructions to instruct a computing device that includes two or more processors configured for parallel processing.

As an example, one or more computer-readable storage media can include computer-executable instructions to define a surface for a two-dimensional grid of cells based at least in part on direction information and to intersect a randomly generated surface with the defined surface. For example, instructions may provide for performing a method that can include generating a surface from arbitrary or other directional data (e.g., a direction field) and then, for example, using the generated surface for intersecting another surface such as a random surface (e.g., a Gaussian random surface conditioned to honor a set of points of fixed elevation).

Figure 15:
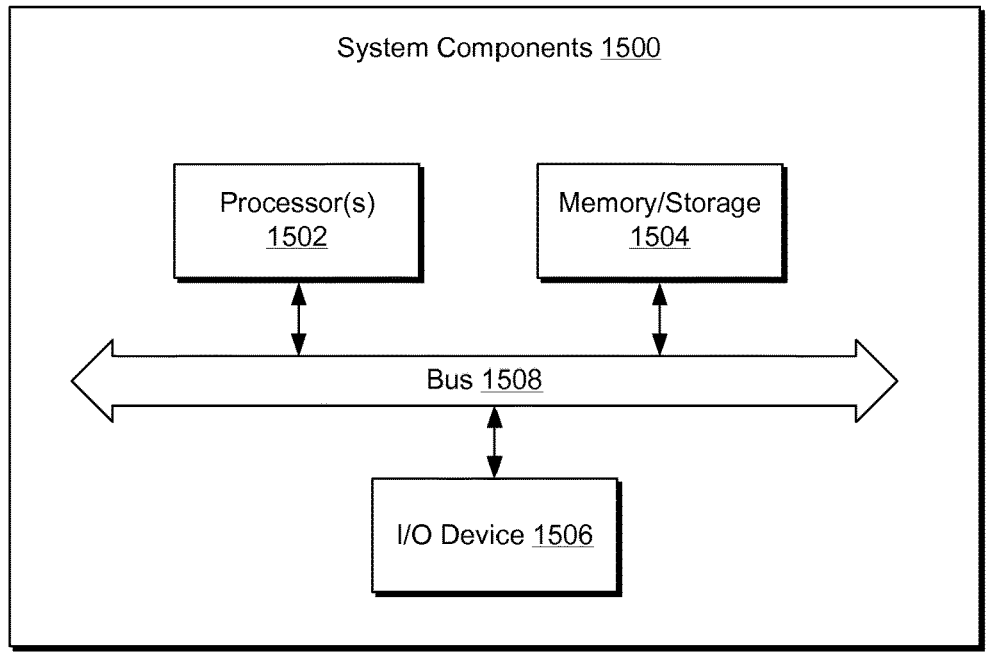
FIG. 15 illustrates example components of a system and a networked system.
Figure 15:
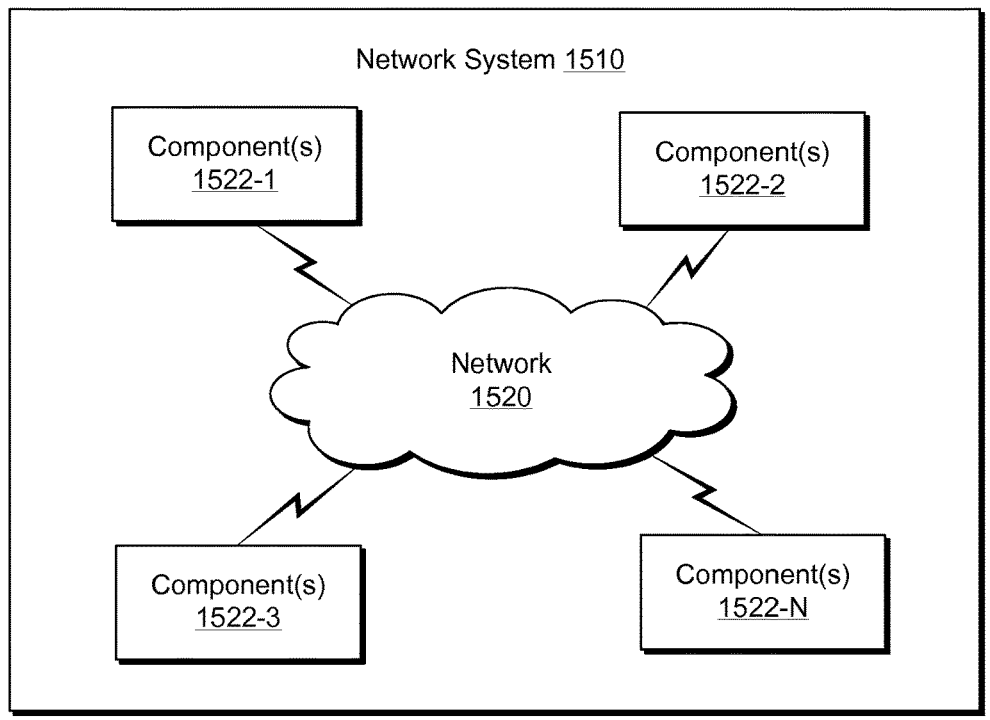

FIG. 15 shows components of an example of a computing system 1500 and an example of a networked system 1510. The system 1500 includes one or more processors 1502, memory and/or storage components 1504, one or more input and/or output devices 1506 and a bus 1508. In an example embodiment, instructions may be stored in one or more computer-readable media (e.g., memory/storage components 1504). Such instructions may be read by one or more processors (e.g., the processor(s) 1502) via a communication bus (e.g., the bus 1508), which may be wired or wireless. The one or more processors may execute such instructions to implement (wholly or in part) one or more attributes (e.g., as part of a method). A user may view output from and interact with a process via an I/O device (e.g., the device 1506). In an example embodiment, a computer-readable medium may be a storage component such as a physical memory storage device, for example, a chip, a chip on a package, a memory card, etc. (e.g., a computer-readable storage medium).

In an example embodiment, components may be distributed, such as in the network system 1510. The network system 1510 includes components 1522-1, 1522-2, 1522-3, . . . 1522-N. For example, the components 1522-1 may include the processor(s) 1502 while the component(s) 1522-3 may include memory accessible by the processor(s) 1502. Further, the component(s) 1502-2 may include an I/O device for display and optionally interaction with a method. The network may be or include the Internet, an intranet, a cellular network, a satellite network, etc.

Although only a few example embodiments have been described in detail above, those skilled in the art will readily appreciate that many modifications are possible in the example embodiments. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words "means for" together with an associated function.

The invention claimed is:

1. A method comprising:
   receiving data values for a spatially distributed variable of the Earth, wherein the data values are acquired via one or more sensors;
   defining a two dimensional grid of cells for a region of the Earth;
   assigning directions to at least some of the cells wherein each of the assigned cells comprises an individual direction associated with at least one feature of the Earth;
   tracing a set of piecewise linear trajectories with respect to the grid based on the directions wherein each piecewise linear trajectory intersects at least one cell boundary at an intersection point;
   from a selected point in the two dimensional grid, determining a set of scalar field values based on at least a portion of the set of piecewise linear trajectories and corresponding direction-based intersection point rules, for predefined directions referenced with respect to a first dimension and to a second dimension of the two dimensional grid, that either increase or decrease a scalar field value;
   outputting a map that comprises local rotations represented by at least a portion of the set of scalar field values;
   processing the data values by applying the map to generate a locally rotated model of the spatially distributed variable data values; and
   rendering an image of at least a portion of the locally rotated model of the spatially distributed variable to a display.

2. The method of claim 1 further comprising rendering a view of the locally rotated model of the spatially distributed variable to the display.

3. The method of claim 1 comprising rotating the directions;
   tracing a second set of piecewise linear trajectories with respect to the grid based on at least a portion of the rotated directions;
   determining a second set of scalar field values based on at least a portion of the second set of piecewise linear trajectories and corresponding direction-based intersection point rules;
   outputting the map based on at least a portion of the first set of scalar field values and at least a portion of the second set of scalar field values.

4. The method of claim 1 wherein the directions represent strike directions of at least one structural feature of the Earth.

5. The method of claim 1 wherein the directions represent dip directions of at least one structural feature of the Earth.

6. The method of claim 3 wherein the rotated directions represent strike directions of at least one structural feature of the Earth.

7. The method of claim 1 wherein the spatially distributed variable comprises a variable associated with one or more channels and wherein the data values comprise seismic image data values.

8. The method of claim 1 further comprising simulating fluid flow using a simulation model and the locally rotated model of the spatially distributed variable to generate simulation results of fluid flow in the Earth.

9. The method of claim 8 further comprising performing history matching for the simulation model based at least in part on at least a portion of the simulation results and measured data acquired from the Earth using sensors.

10. The method of claim 9 further comprising adjusting the directions and outputting an adjusted map.

11. A system comprising:
one or more processors;
memory;
a display; and
computer-executable instructions stored in the memory for execution by at least one of the one or more processor to:
receive data values for a spatially distributed variable of the Earth, wherein the data values are acquired via one or more sensors;
define a grid for a region of the Earth wherein the grid comprises cells and wherein at least some of the cells comprise a respective individual direction of a set of directions associated with at least one feature of the Earth;
trace a set of piecewise linear trajectories for the set of directions associated with the grid wherein each piecewise linear trajectory intersects at least one cell boundary at an intersection point;
from a selected point in the two dimensional grid, determine a set of scalar field values based on at least a portion of the set of trajectories and corresponding direction-based intersection point rules, for predefined directions referenced with respect to a first dimension and to a second dimension of the two dimensional grid, that either increase or decrease a scalar field value;
generate a map that comprises local rotations represented by at least a portion of the set of scalar field values;
process the data values by application of the map to generate a locally rotated model of the spatially distributed variable data values; and
render an image of at least a portion of the locally rotated model of the spatially distributed variable to the display.

12. The system of claim 11 wherein the region of the Earth comprises one or more channels.

13. One or more computer-readable non-transitory storage media comprising computer-executable instructions to instruct a computing device to:
receive data values for a spatially distributed variable of the Earth, wherein the data values are acquired via one or more sensors;
define a two dimensional grid of cells for a region of the Earth;
assign directions to at least some of the cells wherein each of the assigned cells comprises an individual direction associated with at least one feature of the Earth;
trace a set of piecewise linear trajectories with respect to the grid based on the directions wherein each piecewise linear trajectory intersects at least one cell boundary at an intersection point;
from a selected point in the two dimensional grid, determine a set of scalar field values based on at least a portion of the set of piecewise linear trajectories and corresponding direction-based intersection point rules, for predefined directions referenced with respect to a first dimension and to a second dimension of the two dimensional grid, that either increase or decrease a scalar field value;
output a map that comprises local rotations represented by at least a portion of the set of scalar field values;
process the data values by application of the map to generate a locally rotated model of the spatially distributed variable data values; and
render an image of at least a portion of the locally rotated model of the spatially distributed variable to a display.

14. The one or more computer-readable non-transitory storage media comprising computer-executable instructions of claim 13 wherein the directions represent strike directions of at least one structural feature of the Earth.

15. The one or more computer-readable non-transitory storage media comprising computer-executable instructions of claim 13 wherein the directions represent dip directions of at least one structural feature of the Earth.

16. The one or more computer-readable non-transitory storage media comprising computer-executable instructions of claim 13 wherein the spatially distributed variable comprises a variable associated with one or more channels of the Earth.

17. The one or more computer-readable non-transitory storage media comprising computer-executable instructions of claim 13 further comprising computer-executable instructions to instruct the computing device to simulate fluid flow using a simulation model and the locally rotated model of the spatially distributed variable to generate simulation results of fluid flow in the Earth.

18. The method of claim 1 comprising receiving the data values from field equipment that comprises at least one of the one or more sensors wherein the locally rotated model of the spatially distributed variable data values is a refined model.

19. The method of claim 1 wherein the locally rotated model of the spatially distributed variable represents a channel of the Earth and forming a borehole to the channel of the Earth utilizing a rig.

* * * * *